United States Patent
Rafferty et al.

(10) Patent No.: US 12,405,537 B2
(45) Date of Patent: Sep. 2, 2025

(54) DEVICES, SYSTEMS, AND METHODS FOR THE TRANSFORMATION AND CROPPING OF DROP PATTERNS

(71) Applicant: CANON KABUSHIKI KAISHA, Tokyo (JP)

(72) Inventors: Tom H. Rafferty, Austin, TX (US); Ahmed M. Hussein, Austin, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 898 days.

(21) Appl. No.: 17/386,312

(22) Filed: Jul. 27, 2021

(65) Prior Publication Data
US 2023/0033557 A1 Feb. 2, 2023

(51) Int. Cl.
*G03F 7/00* (2006.01)
*G06N 20/00* (2019.01)

(52) U.S. Cl.
CPC ........ *G03F 7/70625* (2013.01); *G03F 7/0002* (2013.01); *G03F 7/70425* (2013.01); *G03F 7/707* (2013.01); *G03F 7/70716* (2013.01); *G06N 20/00* (2019.01)

(58) Field of Classification Search
CPC .............. G03F 7/70625; G03F 7/0002; G03F 7/70425; G03F 7/707; G03F 7/70716; G06N 20/00; B29C 59/00
See application file for complete search history.

(56) References Cited

U.S. PATENT DOCUMENTS

| | | | | |
|---|---|---|---|---|
| 7,387,508 B2* | 6/2008 | Choi | ...................... | B82Y 40/00 33/644 |
| 11,209,730 B2* | 12/2021 | Simpson | ................ | G03F 7/0002 |
| 2009/0004319 A1* | 1/2009 | Resnick | ................. | B82Y 10/00 425/385 |
| 2010/0308485 A1* | 12/2010 | Inanami | ................. | B82Y 10/00 425/150 |
| 2013/0328227 A1* | 12/2013 | McKinnon | ............ | B29C 64/393 425/169 |
| 2017/0351173 A1* | 12/2017 | Funabashi | ............. | G03F 9/7076 |
| 2019/0236755 A1* | 8/2019 | Killebrew | ................. | G06T 1/60 |
| 2020/0043179 A1* | 2/2020 | Chauvin | ................. | G06N 20/00 |
| 2020/0292934 A1 | 9/2020 | Simpson | | |
| 2021/0072638 A1* | 3/2021 | Mitsuyasu | .......... | H01L 21/0271 |
| 2021/0125855 A1 | 4/2021 | Roy | | |
| 2023/0122506 A1* | 4/2023 | Coeck | ..................... | B22F 12/49 425/174 |
| 2024/0154707 A1* | 5/2024 | Outes Carnero | ..... | H04W 24/02 |

FOREIGN PATENT DOCUMENTS

JP 2019062164 A 4/2019

* cited by examiner

*Primary Examiner* — Nahida Sultana
(74) *Attorney, Agent, or Firm* — Canon U.S.A., Inc. IP Division

(57) ABSTRACT

Some devices, systems, and methods obtain one or more images of a substrate, wherein the substrate includes a feature pattern; determine one or more edges of the feature pattern based on the one or more images; determine an offset of the feature pattern relative to the substrate and an angle of the feature pattern relative to the substrate based on the one or more edges of the feature pattern; and generate a transformation for a drop pattern based on the offset of the feature pattern and on the angle of the feature pattern.

23 Claims, 15 Drawing Sheets

DEVICES, SYSTEMS, AND METHODS FOR THE TRANSFORMATION AND CROPPING OF DROP PATTERNS

BACKGROUND

Technical Field

This application generally concerns generating drop patterns for imprint lithography and inkjet-based adaptive planarization.

Background

Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

Some nano-fabrication techniques are commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, and the like.

Some nanoimprint lithography techniques form a feature pattern in a formable material (polymerizable) layer and transfer a pattern corresponding to the feature pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer.

Additionally, planarization techniques are useful in fabricating semiconductor devices. For example, the process for creating a semiconductor device may include repeatedly adding and removing material to and from a substrate. This process can produce a layered substrate with an irregular height variation (i.e., relief pattern), and, as more layers are added, the substrate's height variation can increase. The height variation negatively affects the ability to add further layers to the layered substrate. Moreover, semiconductor substrates (e.g., silicon wafers) themselves are not always perfectly flat and may include an initial surface height variation (i.e., relief pattern). One technique to address height variations is to planarize the substrate between layering procedures. A planarization technique sometimes referred to as inkjet-based adaptive planarization (IAP) involves dispensing a variable drop pattern of polymerizable material between the substrate and a superstrate, where the drop pattern varies depending on the substrate's relief pattern. A superstrate is then brought into contact with the polymerizable material, after which the material is polymerized on the substrate, and the superstrate removed.

Various lithographic patterning techniques benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL), planarization improves feature filling and CD control after pattern transfer.

And a substrate with polymerized material can be further subjected to known procedures and processes for device (article) fabrication, including, for example, curing, oxidation, layer formation, deposition, doping, planarization, etching, formable material removal, dicing, bonding, packaging, and the like.

SUMMARY

Some embodiments of a method comprise obtaining one or more images of a substrate, wherein the substrate includes a feature pattern; determining one or more edges of the feature pattern based on the one or more images; determining an offset of the feature pattern relative to the substrate and an angle of the feature pattern relative to the substrate based on the one or more edges of the feature pattern; and generating a transformation for a drop pattern based on the offset of the feature pattern and on the angle of the feature pattern.

And, in some embodiments of the method, obtaining the one or more images of the substrate includes obtaining a plurality of initial images of the substrate, wherein each image of the plurality of images was captured from a respective imaging location of a plurality of imaging locations; calculating a horizontal chucking offset and a vertical chucking offset based on the plurality of initial images; calculating a chucking angle based on the plurality of initial images; calculating a second transformation based on the horizontal chucking offset, on the vertical chucking offset, and on the chucking angle; transforming the plurality of imaging locations based on the second transformation, thereby generating a plurality of transformed imaging locations; and capturing the one or more images of the substrate, wherein each image of the one or more images is captured from a respective transformed imaging location of the plurality of imaging locations.

Some embodiments of a device comprise one or more computer-readable storage media and one or more processors that are in communication with the one or more computer-readable storage media. The one or more processors cooperate with the one or more computer-readable storage media to cause the device to perform operations that comprise obtaining one or more images of a substrate, wherein the substrate includes a feature pattern; determining an edge of the feature pattern based on the one or more images; determining an offset of the feature pattern relative to the substrate and an angle of the feature pattern relative to the substrate based on the edges of the feature pattern; and generating a transformation for a drop pattern based on the offset of the feature pattern and the angle of the feature pattern.

And, in some embodiments of the device, the operations further comprise determining a bounding shape of the feature pattern; obtaining a substrate active-edge shape; obtaining a superstrate shape; calculating an intersection of the bounding shape of the feature pattern, the superstrate shape, and the substrate active-edge shape; and cropping the transformed drop pattern based on the intersection.

Some embodiments of a system for drop-pattern generation comprise the following: a plurality of image-capturing devices; one or more computer-readable storage media; and one or more processors that are in communication with the one or more computer-readable storage media. The one or more processors cooperate with the one or more computer-readable storage media to cause the system to perform operations that comprise capturing, with the plurality of image-capturing devices, a plurality of images of a substrate, wherein the substrate includes a feature pattern; determining a border of the feature pattern based on the one or more images; determining an offset of the feature pattern relative to the substrate and an angle of the feature pattern relative to the substrate based on the border of the feature pattern; and generating a transformation for a drop pattern based on the offset of the feature pattern and the angle of the feature pattern.

Also, in some embodiments of the system, the operations further comprise capturing, with the plurality of image-capturing devices, a plurality of initial images of the substrate, wherein each image of the plurality of images was captured from a respective imaging location of a plurality of imaging locations; calculating a horizontal chucking offset and a vertical chucking offset based on the plurality of initial images; calculating a chucking angle based on the plurality of initial images; calculating a second transformation based on the horizontal chucking offset, the vertical chucking offset, and the chucking angle; transforming the plurality of imaging locations based on the second transformation, thereby generating a plurality of transformed imaging locations; and sending movement commands to a movable stage that supports the substrate and a chuck that holds the substrate, wherein the movement commands are based on the plurality of transformed imaging locations, and wherein the movement commands position the substrate such that each image-capturing device of the plurality of image-capturing devices is positioned at a respective imaging location of the plurality of transformed imaging locations, wherein each image of the one or more images is captured from a respective transformed imaging location of the plurality of imaging locations.

DESCRIPTION

Figure 1A:
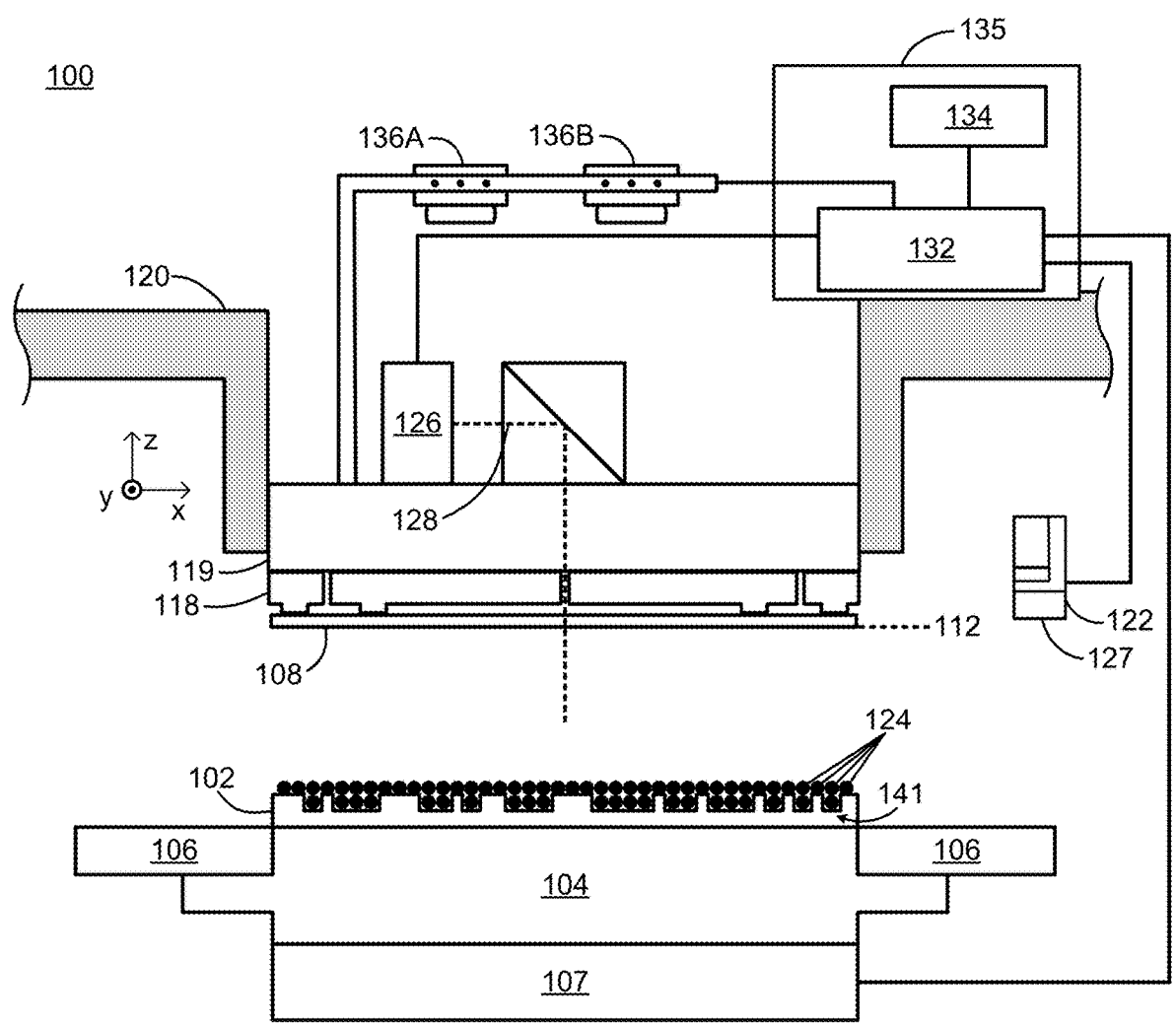
FIG. 1A illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, a camera in a group of cameras may be identified with the reference numeral 136 when a particular camera is not being distinguished. However, 136A may be used to identify a specific camera when the specific camera is being distinguished from the rest of the cameras 136.

FIG. 1A illustrates an example embodiment of a nanoimprint lithography system 100. The nanoimprint lithography system 100 may operate as an IAP system. When operating, the nanoimprint lithography system 100 deposits drops 124 of formable material (e.g., resist) on a substrate 102 (e.g., a wafer), which has a pattern formed therein, and uses a superstrate 108 to planarize the formable material. The substrate includes a feature pattern 141 (e.g., a relief pattern) on a surface that is proximal to the superstrate 108. The feature pattern 141 may be composed of doped regions, etched regions, or other modifications. And the feature pattern 141 may also be composed of formable material (e.g., resist, planarization material), films of insulating material, or metal. For example, the feature pattern 141 may be composed of etchings in one or more underlying layers.

In the embodiment of the nanoimprint lithography system 100 in FIG. 1A, the perimeter of the substrate 102 is surrounded by an applique 106. The applique 106 may be configured to stabilize the local gas environment beneath the superstrate 108 or help protect the substrate 102 and the formable material from particles, for example when the superstrate 108 is separated from the formable material and the substrate 102.

Additionally, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1A, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The superstrate 108 includes a contact surface 112 that faces the substrate 102. Examples of materials that may constitute the superstrate 108 include the following: fused-silica, quartz, silicon, organic polymers, siloxane polymers, borosilicate glass, fluorocarbon polymers, metal, and hardened sapphire. In some embodiments, the superstrate 108 is readily transparent to ultraviolet (UV) light. The contact surface 112 may generally be of the same area or size as, or slightly smaller than, the surface of the substrate 108. The contact surface 112 of the superstrate 108 may be or may include a planar contact surface. In some embodiments (e.g., embodiments that perform Inkjet-based Adaptive Planarization (IAP)), including the embodiment in FIG. 1A, the contact surface 112 is featureless. And, in some embodiments, the contact surface 112 includes features that define a pattern that forms the basis of (e.g., an inverse of) a pattern to be formed on the substrate 102.

The superstrate 108 may be coupled to (e.g., held by, retained by) a superstrate chuck 118. Examples of superstrate chucks 118 include the following: vacuum chucks, pin-type chucks, groove-type chucks, electrostatic chucks, and electromagnetic chucks. The superstrate chuck 118 may be configured to apply a force (e.g., stress, pressure, strain) to the superstrate 108 that varies across the superstrate 108. For example, the superstrate chuck 118 may include a system, such as a zone-based vacuum chuck, an actuator array, a pressure bladder, etc., that can apply a pressure differential to a back surface of the superstrate 108 to cause the superstrate 108 to bend and deform. Additionally, the superstrate chuck 118 may be readily transparent to UV light.

The superstrate chuck 118 may be coupled to a head 119, which in turn may be moveably coupled to a bridge 120 such that the superstrate chuck 118, the head 119, and the superstrate 108 are moveable in at least the z-axis direction. For example, the head 119 may include one or more actuators, such as voice coil motors, piezoelectric motors, linear motors, nut and screw motors, etc., that are configured to move the superstrate chuck 118 and the superstrate 108 in the z-axis direction. And, in some embodiments, one or more of the superstrate chuck 118, the head 119, and the superstrate 108 are also movable in one or more of the x, y, θ, and φ-axes directions. The nanoimprint lithography system 100 may include one or more actuators that move the superstrate 108, the superstrate chuck 118, or the head 119.

Figure 1B:
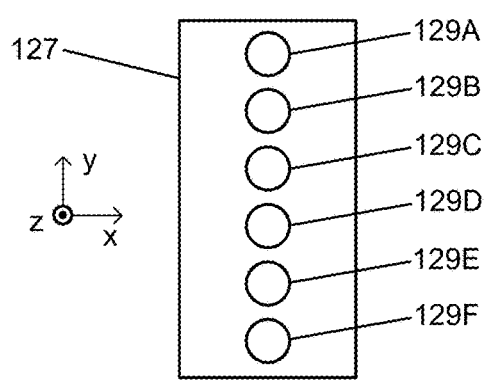
FIG. 1B illustrates an example embodiment of a fluid-dispense head and fluid-dispense ports.

The nanoimprint lithography system 100 also includes a fluid dispenser 122. The fluid dispenser 122 may include a fluid-dispense head 127 and fluid-dispense ports. FIG. 1B illustrates an example embodiment of a fluid-dispense head 127 and fluid-dispense ports 129. The fluid-dispense ports 129 may have a fixed configuration such that the fluid-dispense head 127 and fluid-dispense ports 129 move as a unit and do not move independently of each other. Thus, the fluid-dispense ports 129 may be fixed relative to one another on the fluid-dispense head 127. The number of fluid-dispense ports 129 can vary between embodiments. Although the embodiment in FIG. 1B has six fluid-dispense ports 129, some embodiments have a different number of fluid-dispense ports 129, such as at least two fluid-dispense ports 129, at least three fluid-dispense ports 129, at least four fluid-dispense ports 129, at least five fluid-dispense ports 129, at least ten fluid-dispense ports 129, and at least twenty fluid-dispense ports 129. In some embodiments, the fluid-dispense ports 129 include a set of at least three fluid-dispense ports 129 that lie along a line. In some embodiments, the fluid-dispense head 127 includes hundreds of fluid-dispense ports that lie along multiple parallel lines.

The fluid dispenser 122 may also be moveably coupled to the bridge 120. In some embodiments, the fluid dispenser 122 and the bridge 120 share one or more positioning components. And in some embodiments, the fluid dispenser 122 and the bridge 120 move independently of each other. Also, in some embodiments, the fluid dispenser 122 and the bridge 120 are located in different subsystems of the nanoimprint lithography system 100, and the substrate 102 is moved between the different subsystems.

When operating, the fluid-dispense ports 129 of the fluid dispenser 122 deposits drops 124 of liquid formable material onto the substrate 102, for example according to a drop pattern. The formable material may be, for example, a resist (e.g., photo resist) or another polymerizable material, and the formable material may comprise a mixture that includes a monomer. And the volume of deposited formable material may vary over the area of the substrate 102 based, at least in part, on the substrate's feature pattern 141. Various embodiments of fluid dispensers 122 use different technologies to dispense the drops 124. For example, when the formable material is jettable, ink-jet-type fluid dispensers 122 may be used to dispense the drops 124 of formable material. Thermal ink jetting, microelectromechanical-systems-based (MEMS-based) ink jetting, and piezoelectric ink jetting are examples of technologies for dispensing jettable liquids.

The drops 124 of formable material may be dispensed upon the substrate 102 before or after a desired field volume is defined between the contact surface 112 and the substrate 102, depending on the embodiment. The field volume indicates the volume of formable material required to produce all of the desired features (e.g., to fill the feature pattern 141 on the substrate 102 and form a planarized surface).

The nanoimprint lithography system 100 also includes a curing subsystem that includes an energy source 126 that directs actinic energy (e.g., UV radiation) along an exposure path 128. The head 119 and the substrate positioning stage 107 may be configured to position the superstrate 108 and the substrate 102 along (e.g., in superimposition with) the exposure path 128. The energy source 126 can direct the actinic energy along the exposure path 128 while the superstrate 108 is in contact with the drops 124 of formable material that have been deposited on the substrate 102.

Once the drops 124 of formable material have been deposited on the substrate, the head 119, the substrate positioning stage 107, or both vary a distance between the superstrate contact surface 112 and the substrate 102 to define a desired field volume that is filled by the formable material. For example, the head 119 may apply a force to the superstrate chuck 118 that moves the contact surface 112 of the superstrate 108 into contact with the drops 124 of formable material that are on the substrate 102, such that the drops 124 of formable material spread on the substrate 102. After the desired field volume has been filled with the formable material, the energy source 126 produces energy (e.g., actinic radiation) that is directed along the exposure path 128 to the formable material and that causes the formable material to cure, solidify, or cross-link in conformance to the shape of the substrate's feature pattern 141 and the shape of the contact surface 112. The formable material can be cured while the superstrate 108 is in contact with the formable material, thereby forming a planarized surface on the substrate 102.

The substrate 102 can be further subjected to known procedures and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, and MEMS.

This embodiment of the nanoimprint lithography system 100 also includes a plurality of cameras 136 that are positioned to view the spread of the drops 124 of formable material as the superstrate 108 contacts the drops 124 during a planarization process. At least one of the cameras 136 may be positioned such that an imaging field of the camera 136 is in superimposition with at least part of the exposure path 128. And the system 100 may include one or more optical components (e.g., dichroic mirrors, beam combiners, prisms, lenses, mirrors) that combine the actinic radiation with light to be detected by the cameras 136. The cameras 136 may include one or more of a CMOS sensor, a CCD sensor, a sensor array, a line camera, and a photodetector that are configured to gather light at a wavelength that shows a contrast between regions that are underneath the superstrate 108 and in contact with the drops 124 of formable material and regions that are underneath the superstrate 108 but not in contact with the formable material 124. The cameras 136 may be configured to provide images of the spread of formable material underneath the superstrate 108 or of the separation of the superstrate 108 from cured formable material. The cameras 136 may also be configured to measure interference fringes, which change as the formable material spreads between the gap between the superstrate's contact surface 112 and the substrate's surface.

The nanoimprint lithography system 100 may be regulated, controlled, or directed by one or more processors 132 in communication with one or more other components or subsystems, such as the substrate positioning stage 107, the head 119, the fluid dispenser 122, the energy source 126, or the cameras 136. The one or more processors 132 may operate based on instructions in a computer-readable program stored in one or more computer-readable storage media 134. In some embodiments, including the embodiment in FIG. 1A, the one or more processors 132 and the one or more computer-readable storage media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose controller that has been specially-configured to be a nanoimprint-lithography-system controller.

Examples of computer-readable storage media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

In the embodiment in FIG. 1A, the nanoimprint-lithography-control device 135 may operate as a drop-pattern-generation device, which generates one or more drop patterns, and the nanoimprint-lithography-control device 135 may obtain the one or more drop patterns from another device (e.g., a drop-pattern-generation device) that generated the one or more drop patterns. For example, the one or more processors 132 may be in communication with a networked computer on which analysis is performed and control files, such as drop patterns, are generated. A drop pattern indicates where the fluid dispenser 122 should deposit drops 124 of liquid formable material onto the substrate 102. A drop pattern may be generated based, at least in part, on a field volume or on a feature pattern 141 of the substrate 102. Also, to account for the feature pattern 141 of the substrate 102, the drop density of the drop pattern may vary across the substrate 102. And the drop pattern may have a uniform drop density over regions of the substrate 102 that have a uniform density (e.g., blank areas, or areas where the feature pattern 141 has a uniform feature density).

Figure 2:
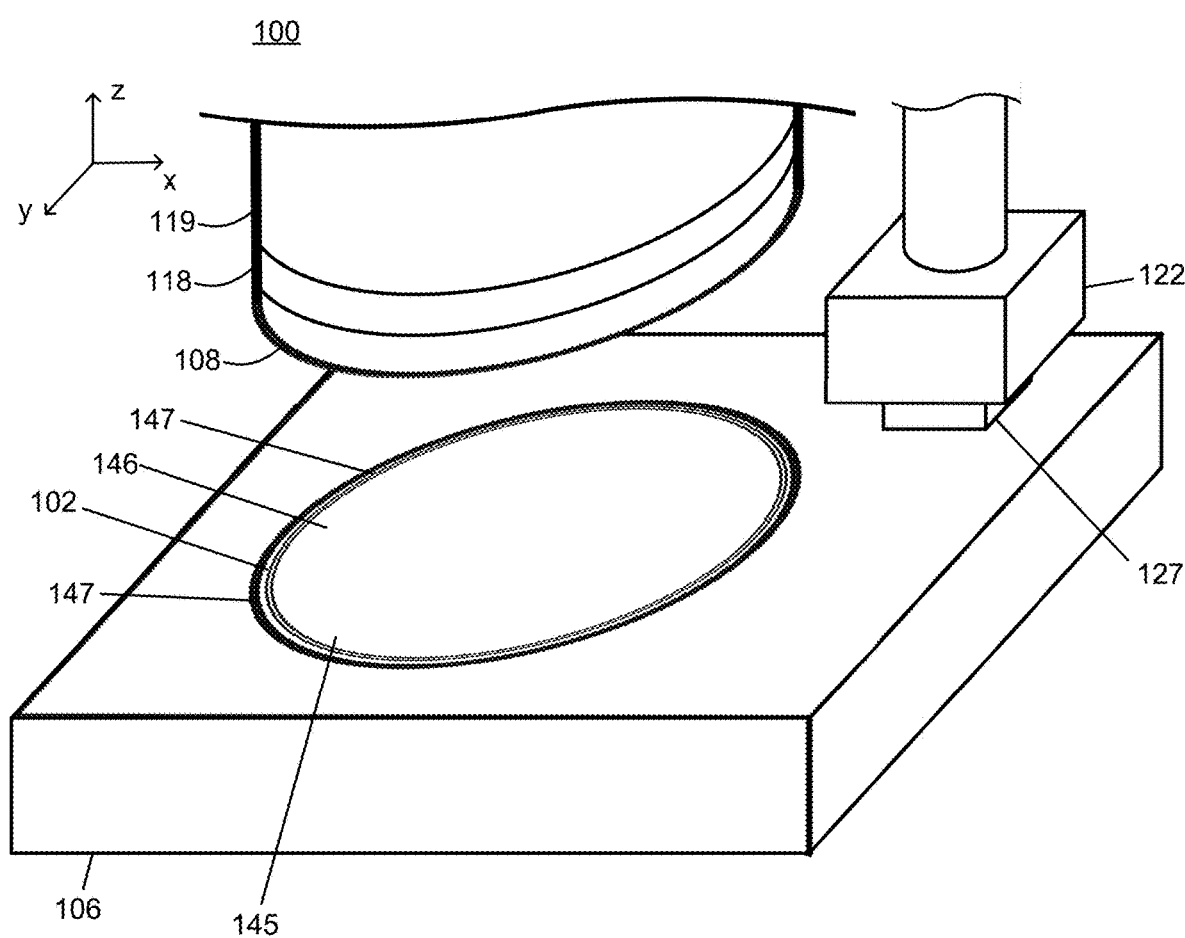
FIG. 2 illustrates a perspective view of an example embodiment of a nanoimprint lithography system.
Figure 3:
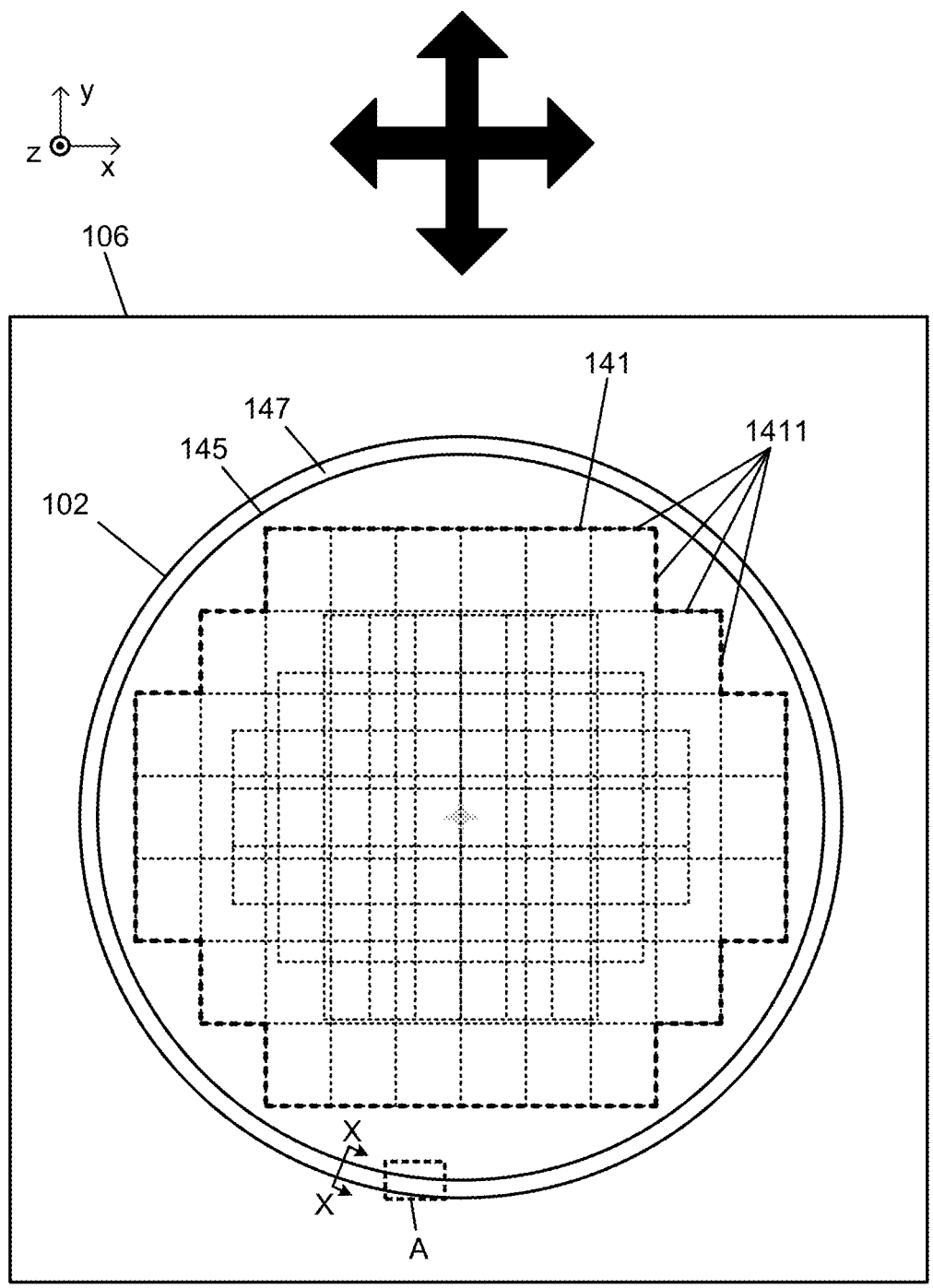
FIG. 3 illustrates a plan view (a view from along the z axis) of an example embodiment of a substrate, an applique, a feature pattern, a planarization zone, and an active edge.
Figure 4A:
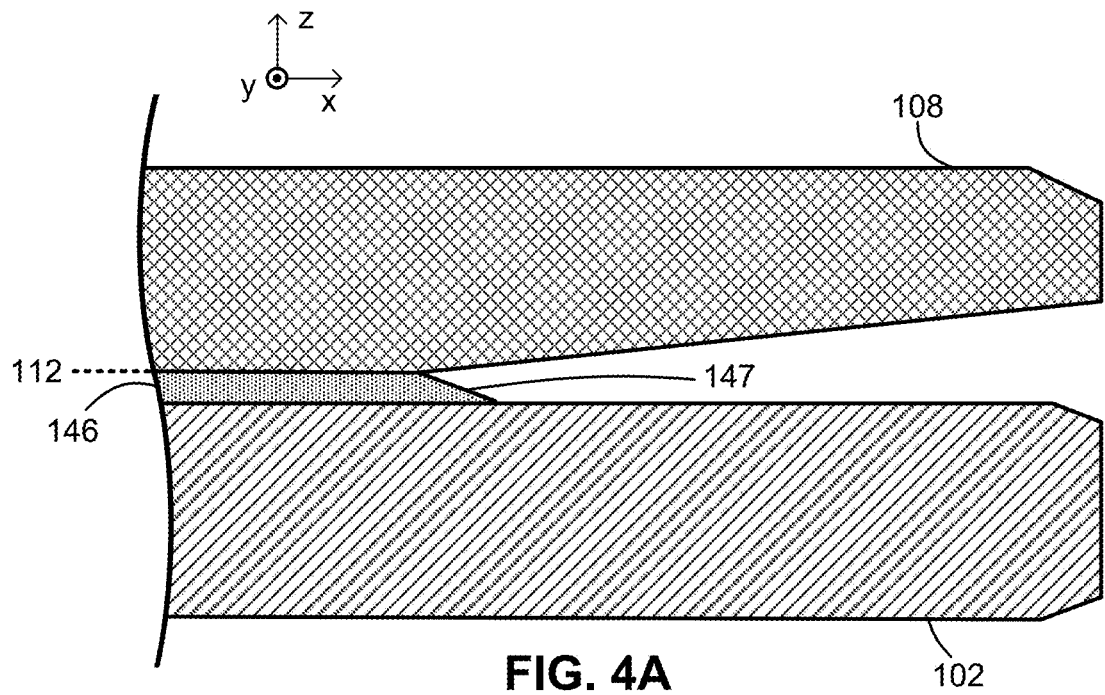
FIGS. 4A-B are partial cross-sectional views, taken from line X-X in FIG. 3.
Figure 4B:
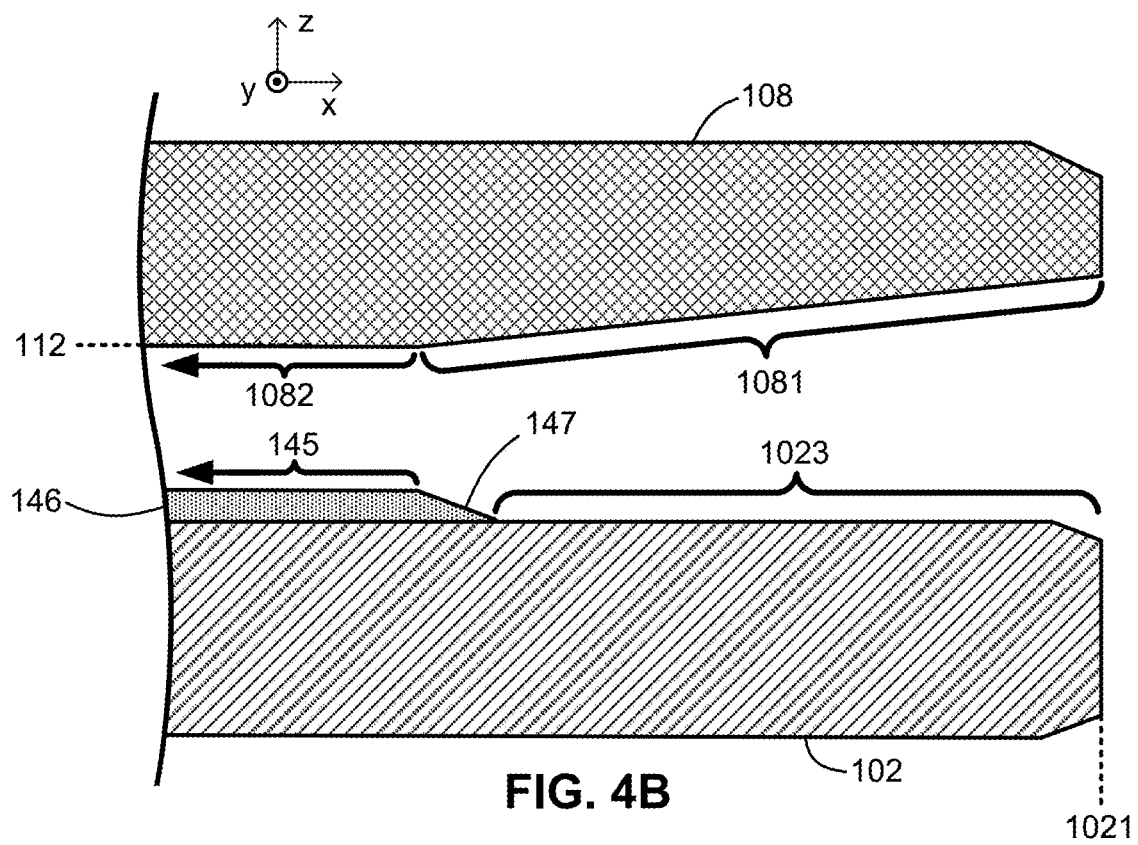

FIG. 2 illustrates a perspective view of an example embodiment of a nanoimprint lithography system 100. This embodiment of a nanoimprint lithography system 100 includes a substrate 102, an applique 106, a fluid dispenser 122, a superstrate 108, a superstrate chuck 118, a head 119, a planarization zone 145, a planarized layer 146 (which has been formed in the planarization zone 145), and an active edge 147. Also, FIG. 3 illustrates a plan view (a view from along the z axis) of an example embodiment of a substrate 102, an applique 106, a feature pattern 141, a planarization zone 145, and an active edge 147. Also, the edges 1411 of the feature pattern 141 collectively define a border of the feature pattern 141. And FIGS. 4A-B are partial cross-sectional views, taken from line X-X in FIG. 3, that illustrate the substrate 102, the superstrate 108, and the active edge 147. FIG. 4A illustrates the superstrate 108 and the substrate 102 when the superstrate 108 is still in contact with the planarized layer 146. FIG. 4B illustrates the superstrate 108 and the substrate 102 after the superstrate 108 is separated from the planarized layer 146.

The substrate positioning stage 107, which supports the applique 106 and the substrate 102, can move the applique 106 and the substrate 102 along both the x axis and the y axis. This allows the substrate positioning stage 107 to position each portion of the substrate 102 under the fluid dispenser 122, which deposits drops of formable material on the substrate 102, and then position the substrate 102 under the superstrate 108, which planarizes the formable material that was deposited on the substrate 102.

The planarization zone 145 on the substrate 102 is a zone where formable material will be planarized, and the boundary of the planarization zone 145 is the active edge 147 of the substrate 102. The active edge 147 is formed from previous processing operations (e.g., formable-material-curing operations). The portion of the substrate 102 that is between the edge of the substrate 102 and the active edge 147 is an exclusion zone 1023.

The superstrate 108 includes a tapered region 1081, as shown in FIGS. 4A-B. The portion of the superstrate 108 that lies within the tapered region 1081 is the superstrate contact area 1082. The shape of the superstrate contact area 1082 (superstrate-contact-area shape), which is defined by the tapered region 1081, may be an ellipse or a circle when viewed along the z axis. The portion of the substrate 102 that is between the substrate's edge 1021 and the active edge 147 is the exclusion zone 1023. The portion of the substrate 102 that lies within the inner diameter of the active edge 147 is the planarization zone 145.

Figure 5:
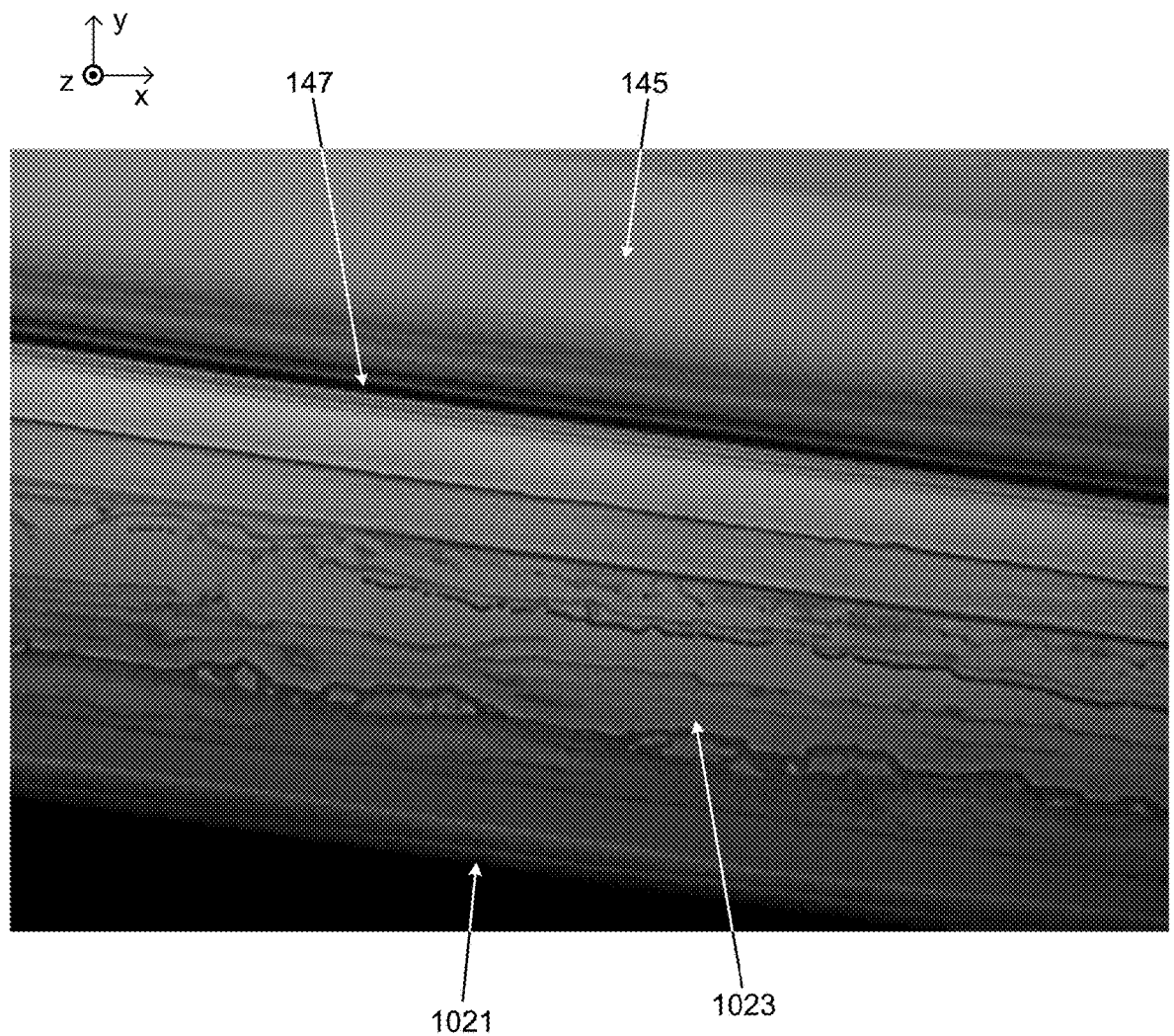
FIG. 5 illustrates an example embodiment of region A from FIG. 3.

FIG. 5 illustrates an example embodiment of region A from FIG. 3. FIG. 5 shows the substrate's edge 1021, the exclusion zone 1023, the active edge 147, and the planarization zone 145.

Figure 6A:
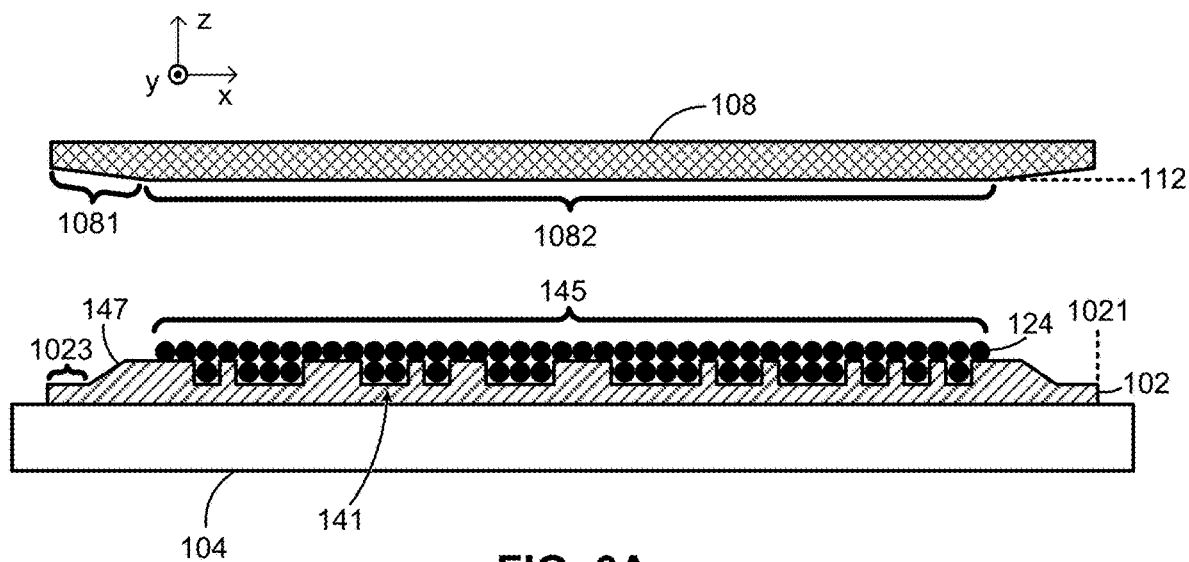
FIGS. 6A-C illustrate a planarization process.
Figure 6B:
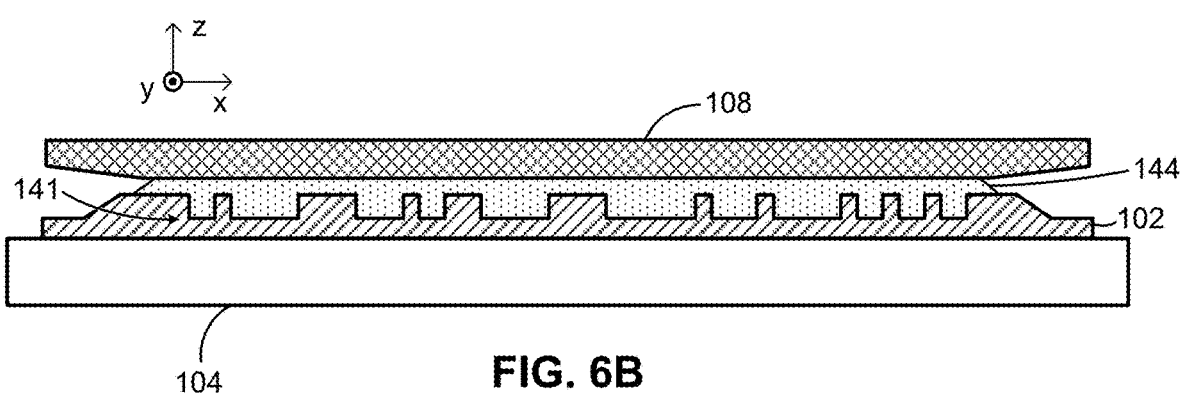
Figure 6C:
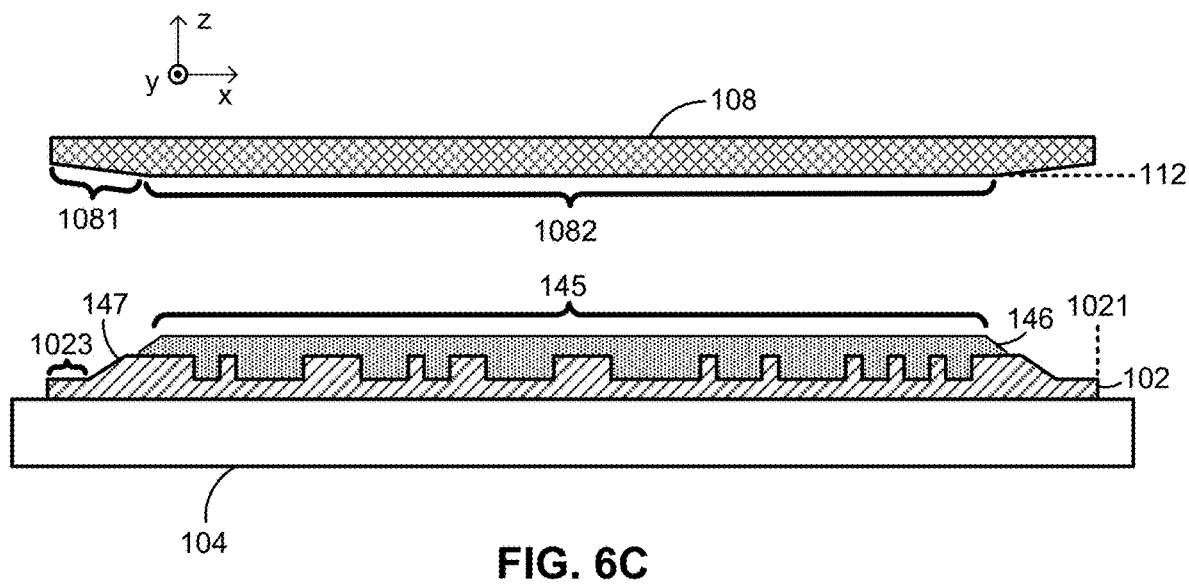

FIGS. 6A-C illustrate a planarization process. As illustrated in FIG. 6A, drops 124 of formable material are dispensed onto the substrate 102 in the planarization zone 145. No drops 124 are deposited in the exclusion zone 1023. The substrate's surface has a feature pattern 141, which may be known based on previous processing operations or may be measured using a profilometer, AFM, SEM, or an optical surface profiler based on optical interference effects, such as the Zygo NewView 8200. The local volume density of the drops 124 of deposited formable material is varied depending on the substrate's feature pattern 141. The contact surface 112 of the superstrate contact area 1082 is then positioned in contact with the drops 124 of formable material.

In FIG. 6B, the contact surface 112 of the superstrate 108 has been brought into full contact with the formable material, but a polymerization process has not been started. As the superstrate 108 contacts the formable material, the drops 124 of formable material merge to form a formable-material film 144 that fills the volume (which includes the feature pattern 141) that is between the superstrate 108 and the substrate 102. Preferably, the filling process happens in a uniform manner without any air or gas bubbles being trapped between the superstrate 108 and the substrate 102 in order to minimize non-fill defects.

The polymerization process, or curing of the formable material, may be initiated with actinic radiation (e.g., UV radiation). For example, the radiation source 126 in FIG. 1A can provide the actinic radiation that causes the formable-material film 144 to cure, solidify, or cross-link, thereby forming a planarized layer 146 on the substrate 102. Additionally, the curing of the formable-material film 144 can also be conducted by using heat, pressure, a chemical reaction, other types of radiation, or any combination of these. Once the cured planarized layer 146 is formed, the superstrate 108 can be separated therefrom. FIG. 6C illustrates the planarized layer 146 on the substrate 102 after separation of the superstrate 108. The substrate 102 and the planarized layer 146 may then be subjected to additional known steps and processes for device (article) fabrication, including, for example, patterning, curing, oxidation, layer formation, deposition, doping, planarization, etching, formable material removal, dicing, bonding, and packaging, and the like. Thus, a feature pattern may be added on/to/through the planarized layer 146, and the planarized layer 146 (which has the feature pattern) may be used as the substrate for another planarization process. If the planarized layer 146 (which has the feature pattern) is used as the substrate for another planarization process, the active edge 147 and the planarization zone 145 may be modified. For example, the width of the active edge 147 may increase, and the radius of the planarization zone 145 may decrease. Additionally, the substrate 102 may be processed to produce a plurality of articles (e.g., devices).

Figure 7:
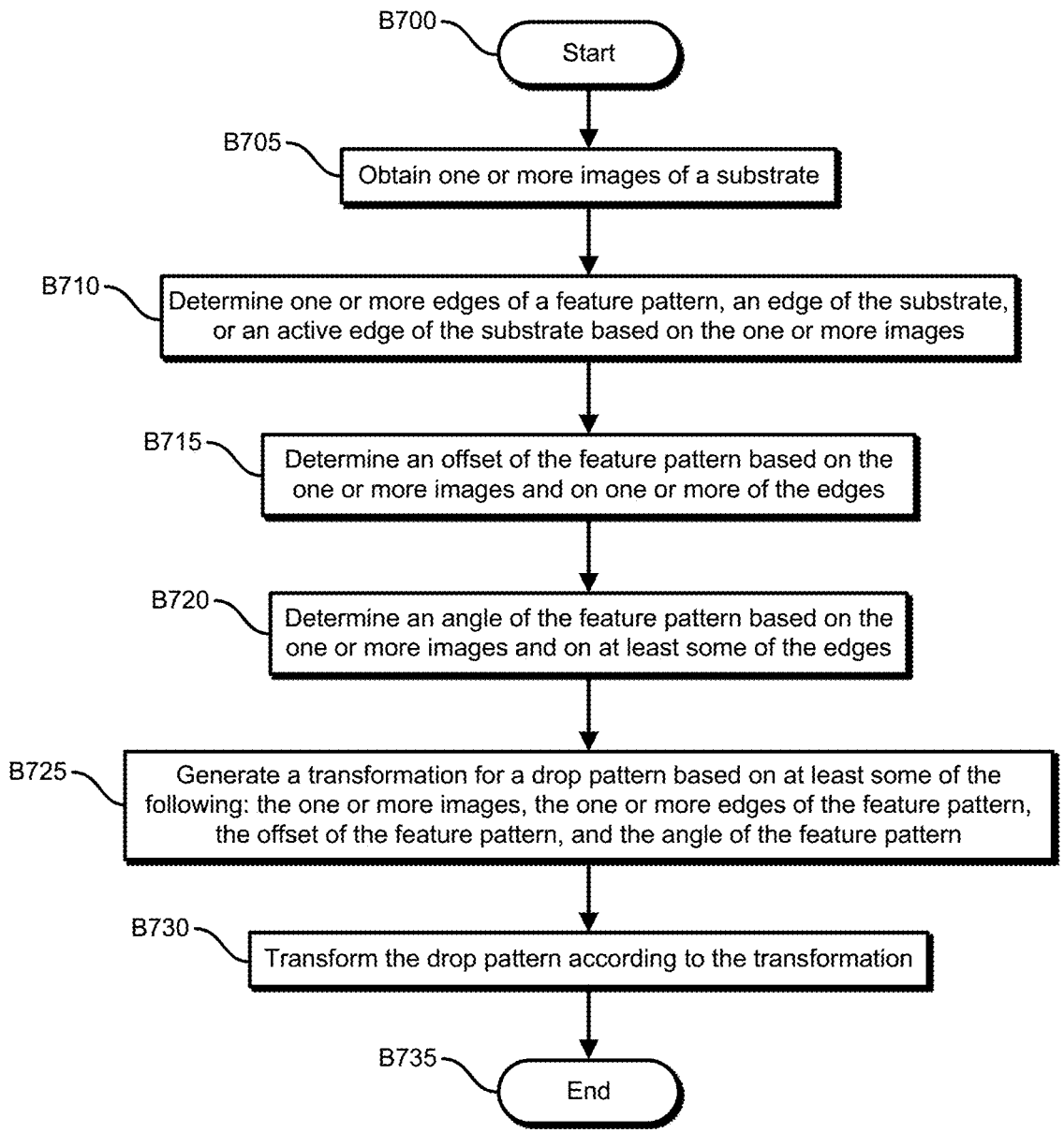
FIG. 7 illustrates an example embodiment of an operational flow for generating a drop pattern.

FIG. 7 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Figure 10:
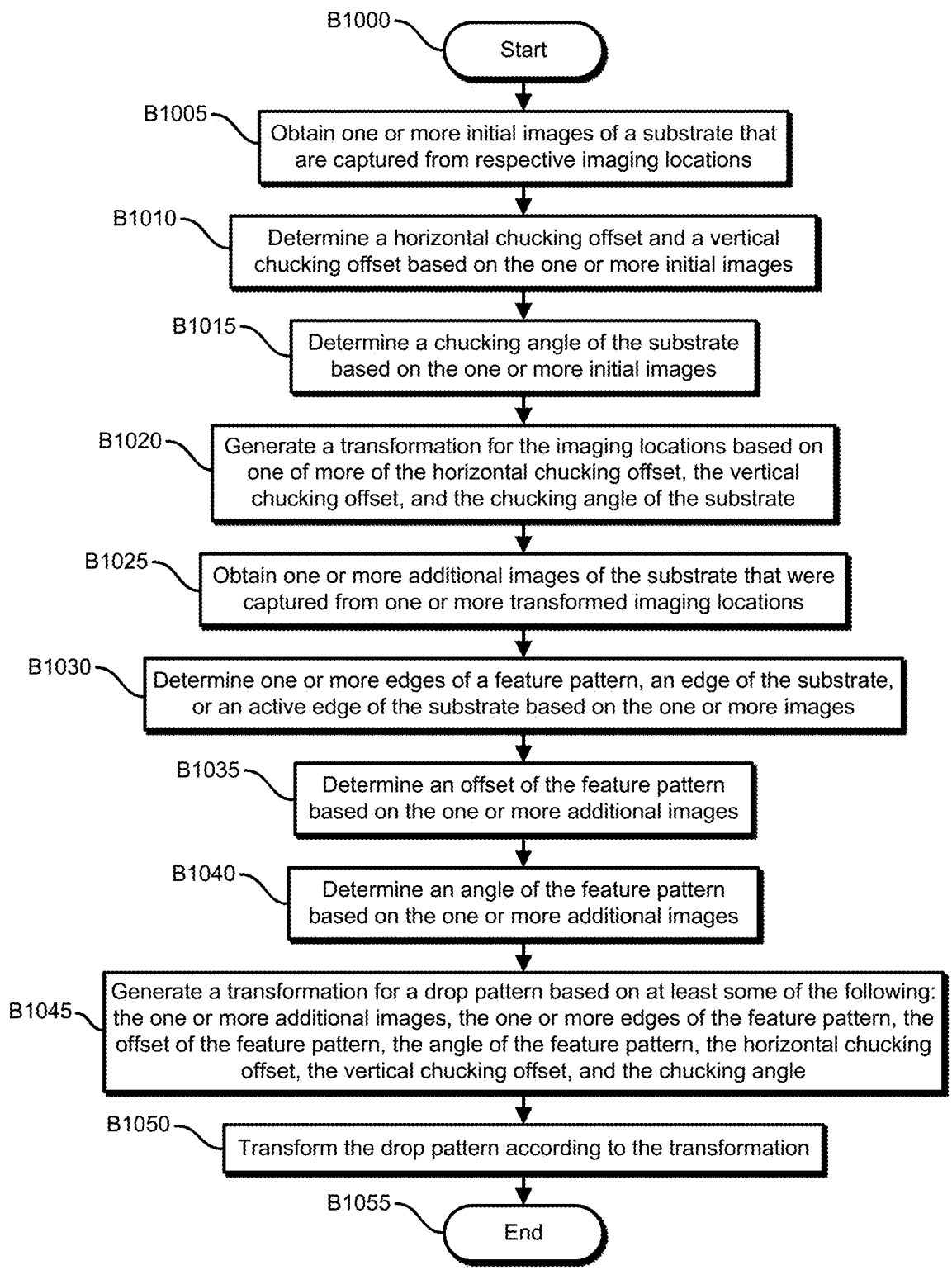
FIG. 10 illustrates an example embodiment of an operational flow for generating a drop pattern.
Figure 12:
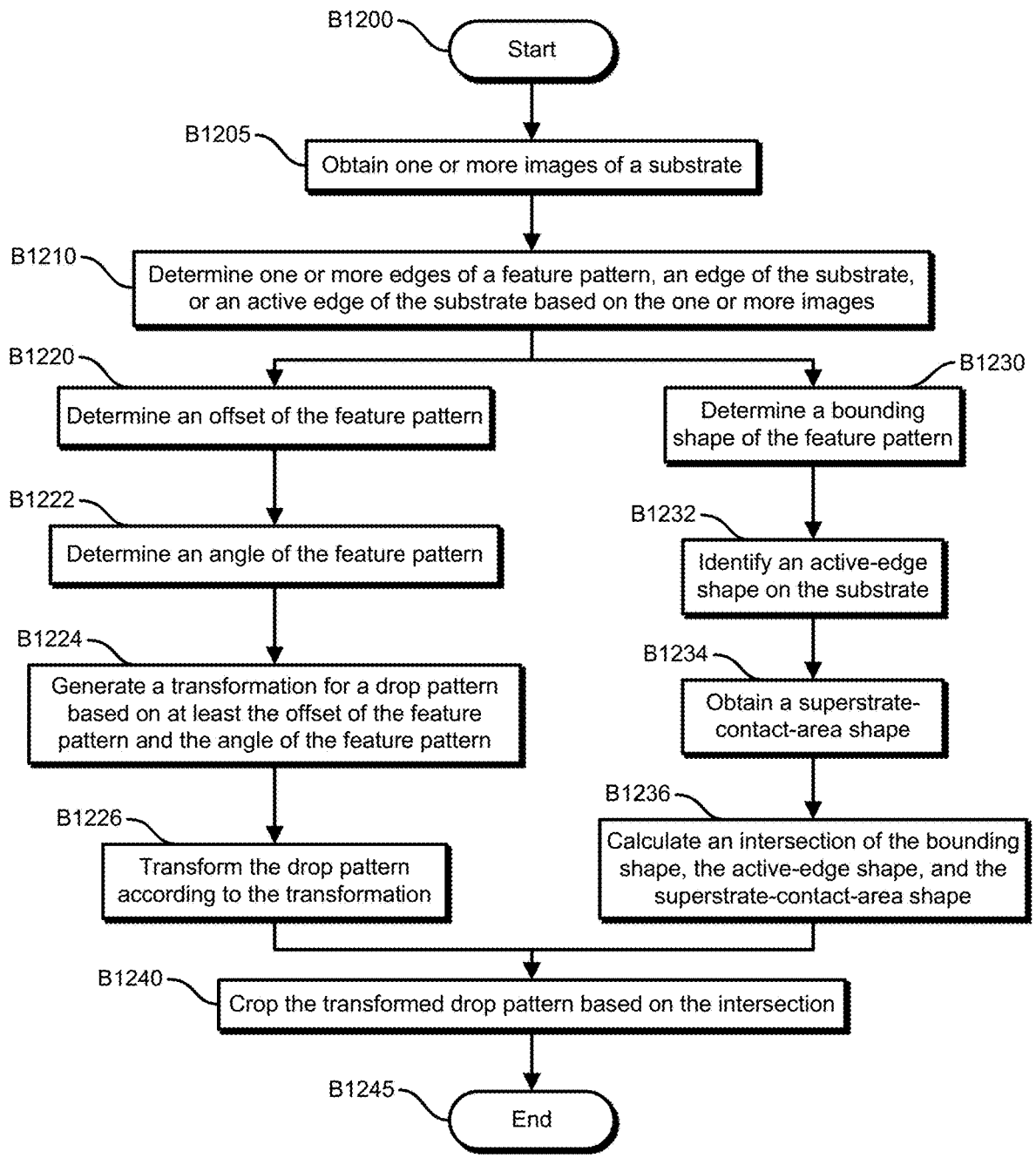
FIG. 12 illustrates an example embodiment of an operational flow for generating a drop pattern.

Furthermore, although the operational flow in FIG. 7 and the operational flows that are described in FIGS. 10 and 12 are performed by a drop-pattern-generation device, some embodiments of these operational flows are performed by two or more drop-pattern-generation devices or by one or more other specially-configured computing devices (e.g., a nanoimprint-lithography-control device).

In FIG. 7, the flow starts in block B700 and then proceeds to block B705, where the drop-pattern-generation device obtains one or more images of a substrate (e.g., from the cameras 136 in FIG. 1A). Next, in block B710, the drop-pattern-generation device determines (e.g., detects), based on the one or more images, at least some of the following: one or more edges of a feature pattern, an edge of the substrate, and an active edge of the substrate. For example, the drop-pattern-generation device may determine the border of a feature pattern based on the one or more images. Also, the drop-pattern-generation device may use one or more machine-learning models (e.g., neural networks) to determine the edges.

Figure 8:
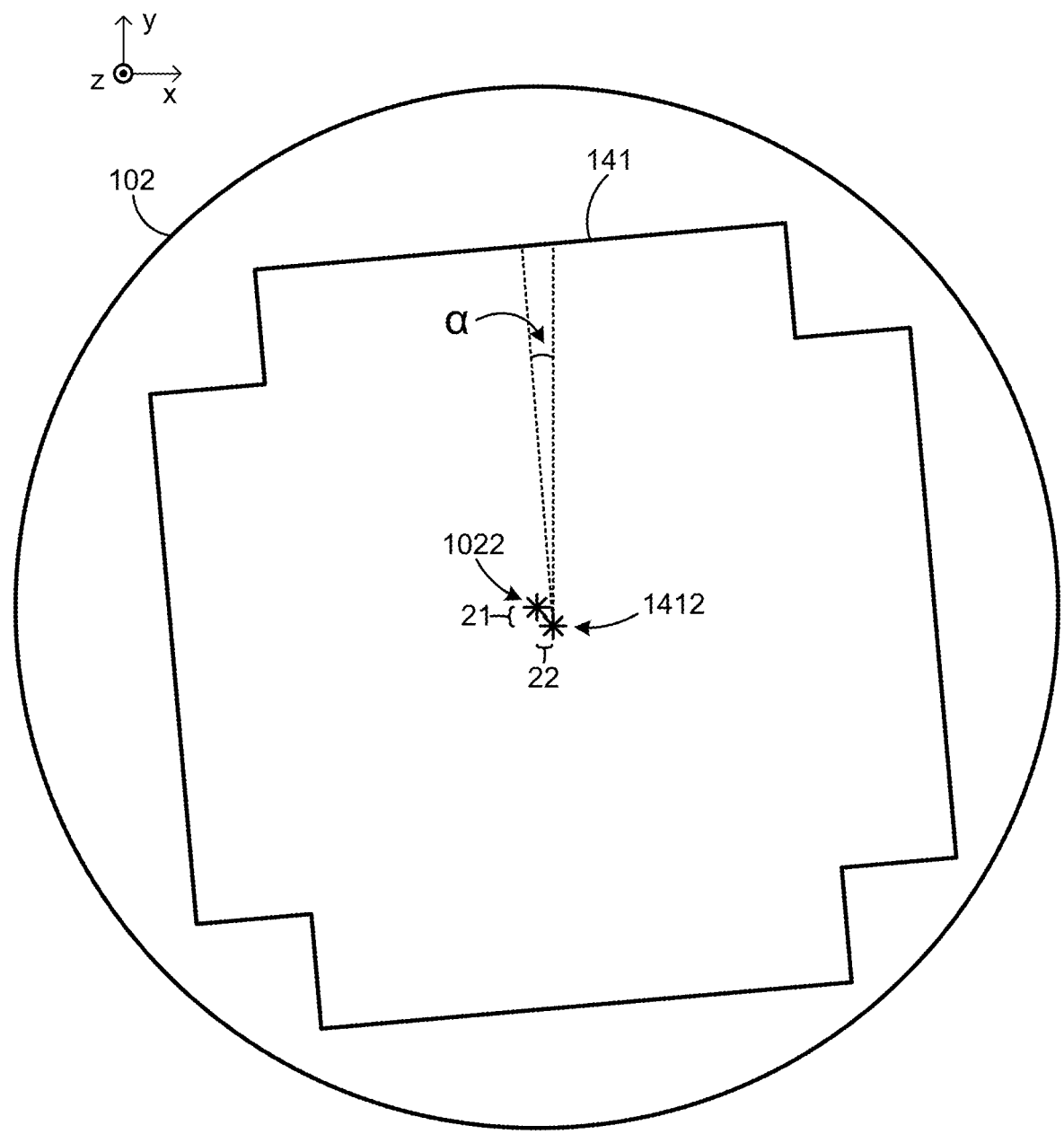
FIG. 8 illustrates an example embodiment of a feature pattern on a substrate.

The flow then moves to block B715, where the drop-pattern-generation device determines an offset of the feature pattern based on the one or more images, and, in some embodiments, on one or more of the edges (which may include one or more of the following: the substrate edge, the one or more feature pattern edges, and the active edge). Block B715 may include identifying a center of the feature pattern and a center of the substrate, for example based on the one or more edges of the feature pattern and the edge of the substrate. For example, FIG. 8 illustrates an example embodiment of a feature pattern 141 on a substrate 102. As indicated by the feature pattern's center 1412 and the substrate's center 1022, the feature pattern 141 is offset from the substrate 102. In this example, the feature pattern 141 has a y-axis offset 21 and an x-axis offset 22 from the substrate 102.

A planarization process (or imprinting process) may be just a part of a multi-procedure process that is used to generate multiple layers. All of the different layers need to be aligned with each other, but they may not need to be aligned with the center of the substrate. Thus, the first layer on a substrate that has a feature pattern (L0 pattern) may determine a preferred location of all subsequent layers. The actual placement of the L0 pattern has some inherent variability relative to the substrate center, and the substrate-to-substrate variability of L0 pattern's placement may be large enough to require unique drop patterns to be transformed or cropped specifically for each area or layer that is being planarized or imprinted. Thus, whereas planarizing or imprinting with a given drop pattern may be ideal for some substrates, it may cause excess or insufficient formable-material-related defects on other substrates that have a different L0 pattern placement on the substrate or a different substrate topography. Consequently, the drop-pattern-generation device accounts for some or all of the following: variations of the substrate, variations of the position of a feature pattern on the substrate, variations of the angle of a feature pattern on the substrate, variations of a mounting position of a substrate on a substrate chuck, and variations of a mounting angle of a substrate on a substrate chuck.

Then, in block B720, the drop-pattern-generation device determines an angle of the feature pattern based on the one or more images and, in some embodiments, on at least some of the edges (the substrate edge, the one or more feature pattern edges, and the active edge). The angle may be relative to a preferred axis (e.g., a movement axis of the substrate chuck, an axis of a fluid-dispense head, an axis defined by imaging positions of the cameras). For example, in FIG. 8, the feature pattern 141 has an angle α of 5 degrees relative to the y axis and the x axis, which is a movement axis of the substrate chuck in this example.

The flow then advances to block B725, where the drop-pattern-generation device generates a transformation for a drop pattern based on at least some of the following: the one or more images, the one or more edges of the feature pattern, the offset of the feature pattern, and the angle of the feature pattern. For example, some embodiments of the drop-pattern-generation device generate the transformation for the drop pattern based on (e.g., using) the offset of the feature pattern and the angle of the feature pattern, and without directly using the one or more images or the one or more edges of the feature pattern. The transformation may include both a translation and a rotation. For example, the transformation may include a translation that moves the drop pattern in a direction and distance that is equal (or approximately equal) to the offset of the feature pattern and a rotation that rotates the drop pattern by an angle that is equal (or approximately equal) to the angle of the feature pattern.

Figure 9A:
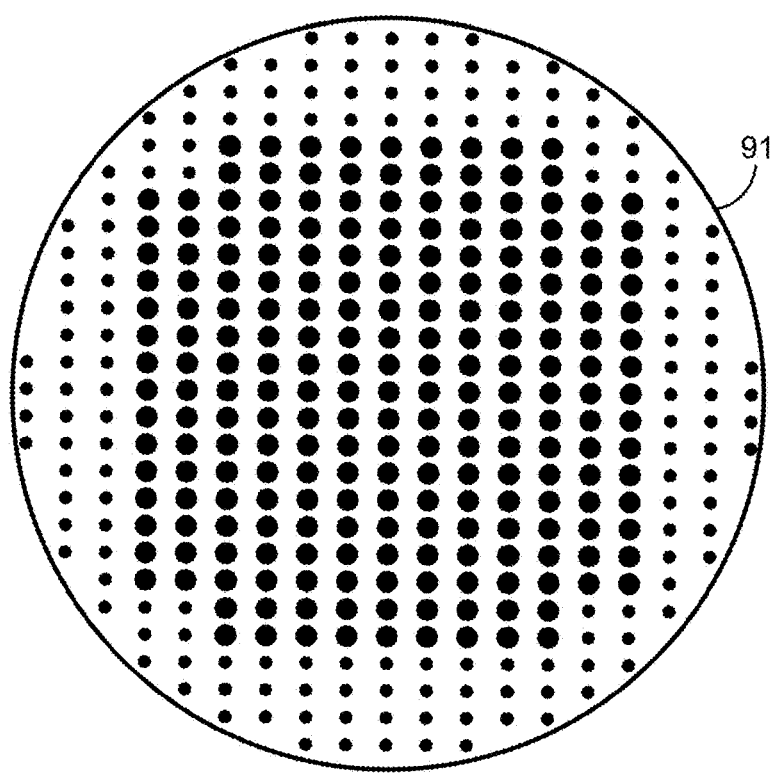
FIG. 9A illustrates an example embodiment of a drop pattern.
Figure 9B:
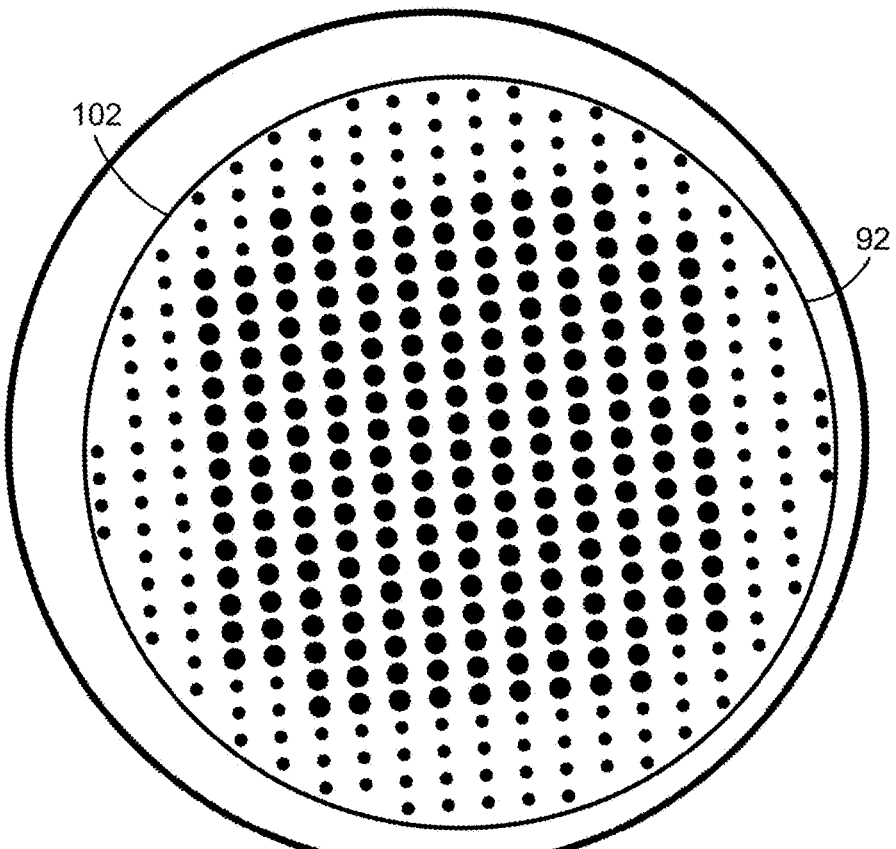
FIG. 9B illustrates an example embodiment of a transformed drop pattern.

Then, in block B730, the drop-pattern-generation device obtains a drop pattern (e.g., a predetermined drop pattern for the feature pattern that is stored in a storage device) and transforms the drop pattern according to the transformation, thereby generating a transformed drop pattern. For example, FIG. 9A illustrates an example embodiment of a drop pattern 91, and FIG. 9B illustrates an example embodiment of a transformed drop pattern 92. The transformed drop pattern 92 was generated by transforming the drop pattern 91 in FIG. 9A. The transformation included both a translation and a rotation. Also, for reference, FIG. 9B shows a substrate 102.

The flow then ends in block B735.

A nanoimprint lithography system can obtain the transformed drop pattern and deposit drops of formable material on the substrate according to the transformed drop pattern.

FIG. 10 illustrates an example embodiment of an operational flow for generating a drop pattern. The flow starts in block B1000 and then moves to block B1005, where a drop-pattern-generation device obtains one or more initial images of a substrate that are captured from respective imaging locations. Next, in block B1010, the drop-pattern-generation device determines a horizontal chucking offset and a vertical chucking offset based on the one or more initial images. For example, the drop-pattern-generation device may use machine vision to detect the active edge of the substrate, and then use the active edge to determine the horizontal chucking offset and the vertical chucking offset. When substrates are mounted on a substrate chuck, there may be variations of the positions and angles of the substrates. Thus, substrates may have variations in their positions and angles, although these variations may be very small (e.g., less than a millimeter, less than 100 micrometers). Then, in block B1015, the drop-pattern-generation device determines a chucking angle of the substrate based on the one or more initial images. For example, the drop-pattern-generation device uses the active edge to determine the chucking angle of the substrate.

The flow then moves to block B1020, where the drop-pattern-generation device generates a transformation for the imaging locations based on one or more of the following: the horizontal chucking offset, the vertical chucking offset, and the chucking angle of the substrate. For example, ideal imaging locations may be stored (e.g., by the drop-pattern-generation device, by a nanoimprint lithography system), and transformations between the ideal imaging locations and the respective imaging locations from block B1005 may be determined. The ideal imaging locations are imaging locations that are defined relative to the substrate's position and orientation and that establish points of reference that can be used to detect offsets and angles of feature patterns on substrates. The ideal imaging locations can be used to distinguish between chucking offsets and feature-pattern offsets and between chucking angles and feature-pattern angles. For example, when images of different substrates are captured from the ideal imaging locations, the positions and angles of the different substrates will be identical in the images. Thus, the offsets and angles of the feature patterns, relative to the substrate, can be identified and distinguished from offsets and angles that are caused by the position of the substrate on the substrate chuck.

In some embodiments, a single field pattern may be laid across multiple locations of a substrate in a layout of fields. Layout information may include the single field pattern and layout of fields information (the field pattern and/or the layout of fields may be in a GDS file). The ideal imaging locations may be determined based on layout information of the underlying (L0) field pattern, and the layout of fields on the substrate. In some embodiments, a point of reference may be defined by some set of unique features that are located somewhere within each field on the substrate. That point of reference may be described in the layout information for each field. The layout information can be used to estimate a predicted location of each ideal imaging location on the substrate. Then for each substrate, target locations may be obtained of each of these ideal imaging locations on the substrate, so that a measured location of these points of reference can be obtained, which will vary from substrate to substrate. The comparison of these measured locations with respect to the ideal imaging locations can be used to determine the feature-pattern offsets and the feature-pattern angles.

Figure 11A:
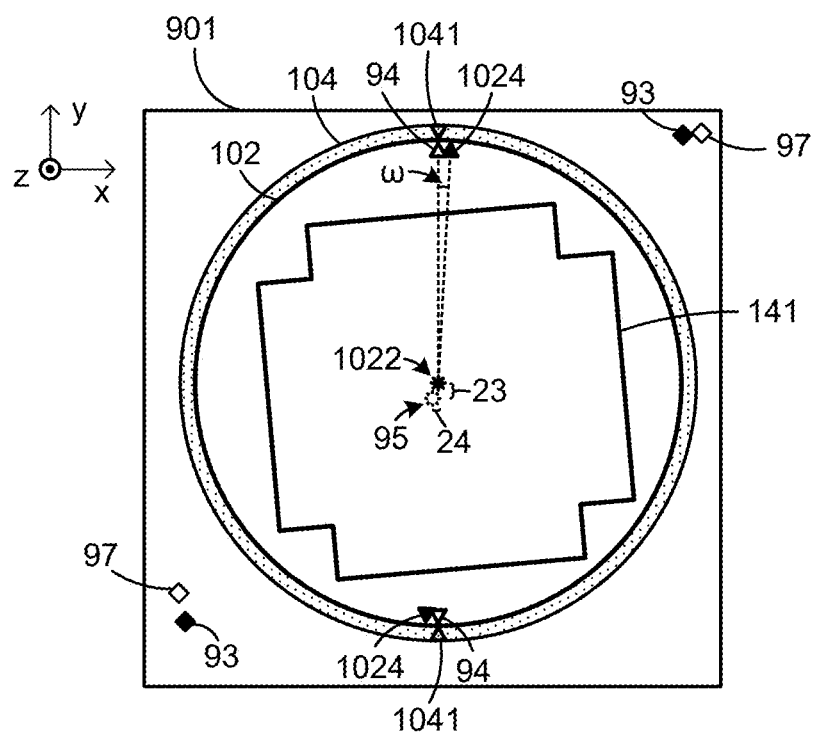
FIG. 11A illustrates an example embodiment of an initial image of a substrate.

For example, FIG. 11A illustrates an example embodiment of an initial image of a substrate. And FIG. 11A shows the image capturing position 93 that was used to capture the image 901 of the substrate 102 and the ideal imaging position 97. Relative to a substrate in images that are captured from the ideal imaging position 97, the substrate 102 in the image 901 has a vertical chucking offset 23 and a horizontal chucking offset 24, which are shown with the substrate's center 1022 and the ideal center 95.

Additionally, the substrate 102 includes one or more marks 1024 (e.g., notches), and the ideal positions 94 of the marks (the positions where the marks would be if the image 901 was captured from the ideal imaging positions 97) are also shown. The one or more marks 1024 can be used to determine the chucking angle ω of the substrate. For example, some embodiments of the drop-pattern-generation device analyze the image 901 to visually determine the positions of the one or more marks 1024 relative to the ideal positions 94, and then determine the chucking angle ω based on the relative positions. Also, some embodiments of the substrate chuck 104 (or the applique) include alignment marks 1041, and some embodiments of the drop-pattern-generation device analyze the image 901 to visually determine the positions of the one or more marks 1024 relative to the alignment marks 1041 and then determine the chucking angle ω based on the relative positions.

The drop-pattern-generation device generates a transformation that can be used to capture one or more images of the substrate that show the substrate from the ideal imaging position 97. For example, the drop-pattern-generation device may generate a single transformation, which can be used to move a substrate positioning stage so that a camera captures one or more images of the substrate 102 from the ideal imaging position. And the drop-pattern-generation device may generate a respective transformation for each camera, which can then be moved to the ideal imaging positions according to their respective transformations.

Figure 11B:
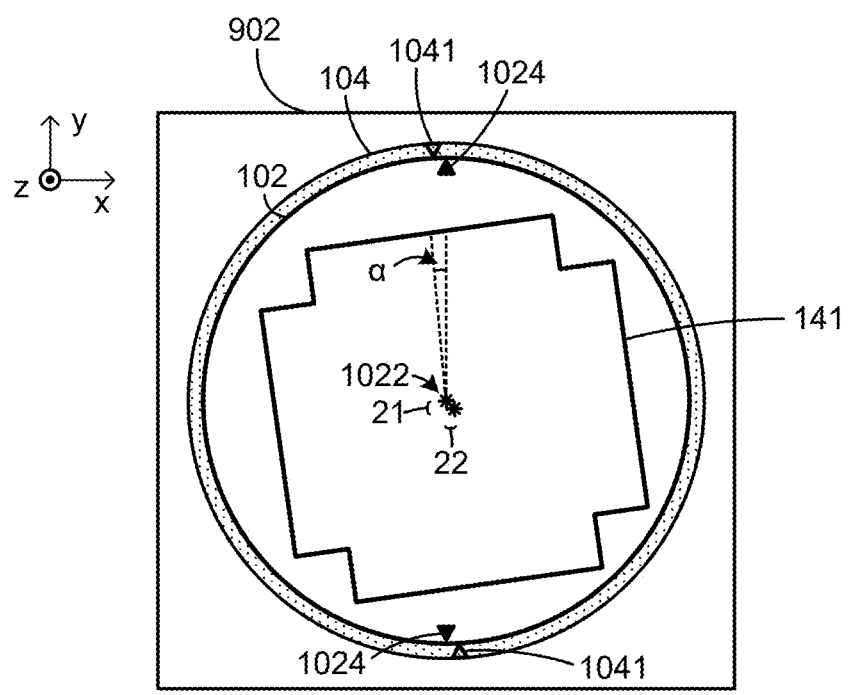
FIG. 11B illustrates an example embodiment of an additional image.

Next, in block B1025, the drop-pattern-generation device obtains one or more additional images of the substrate that were captured from one or more transformed imaging locations. For example, the drop-pattern-generation device may provide the transformation for the imaging locations to a nanoimprint lithography system, which can move the substrate by moving a substrate positioning stage according to the transformation for the imaging locations, then capture the one or more additional images of the substrate using one or more cameras, and then provide the one or more additional images of the substrate to the drop-pattern-generation device. Or, if a nanoimprint-lithography-control device operates as the drop-pattern-generation device, then the nanoimprint-lithography-control device can control the substrate positioning stage to move according to the transformation for the imaging locations and then capture the one or more additional images of the substrate using one or more cameras. Also, in embodiments in which a transformation is generated for each camera, the nanoimprint-lithography-control device can move the cameras according to their respective transformations and then capture the one or more additional images of the substrate. FIG. 11B illustrates an example embodiment of an additional image. The additional image 902 was captured from a transformed imaging location that was transformed according to a transformation that was generated based on the vertical chucking offset 21, the horizontal chucking offset 22, and the chucking angle φ in FIG. 11A.

Accordingly, blocks B1005-B1025 capture images that can compensate for variations in the position and angle of a substrate on a substrate chuck. Substrates of the same size and shape, but that have different chucking offsets and angles, will appear at the same position and angle (within an error tolerance) in the additional images. This allows variations in the position and angle of a feature pattern on the substrate to be distinguished from variations in the position and chucking angle of the substrate on the substrate chuck.

The flow then advances to block B1030, where the drop-pattern-generation device determines (e.g., detects), based on the one or more additional images, at least some of the following: one or more edges of a feature pattern, an edge of the substrate, and an active edge of the substrate. The flow then moves to block B1035, where the drop-pattern-generation device determines an offset of the feature pattern based on the one or more additional images, and, in some embodiments, on at least some of the edges (which may include one or more of the following: the substrate edge, the one or more feature pattern edges, and the active edge). Then, in block B1040, the drop-pattern-generation device determines an angle of the feature pattern based on the one or more additional images and, in some embodiments, on at least some of the edges (which may include one or more of the following: the substrate edge, the one or more feature pattern edges, and the active edge). For example, FIG. 11B also illustrates the vertical offset 21, the horizontal offset 22, and the angle α of the feature pattern 141.

The flow then advances to block B1045, where the drop-pattern-generation device generates a transformation for a drop pattern based on at least some of the following: the one or more additional images, the one or more edges of the feature pattern, the offset of the feature pattern, the angle of the feature pattern, the horizontal chucking offset, the vertical chucking offset, and the chucking angle of the substrate. For example, the transformation may be based on the accumulated offsets (the offset of the feature pattern, the horizontal chucking offset, the vertical chucking offset) and angles (the angle of the feature pattern, the chucking angle of the substrate). Also, the generation of the transformation may not directly use the one or more additional images or the one or more edges of the feature pattern.

Then, in block B1050, the drop-pattern-generation device obtains a drop pattern (e.g., a predetermined drop pattern for the feature pattern that is stored in a storage device) and transforms the drop pattern according to the transformation, thereby generating a transformed drop pattern. The flow then ends in block B1055. And a nanoimprint lithography system can obtain the transformed drop pattern and deposit drops of formable material on the substrate according to the transformed drop pattern.

FIG. 12 illustrates an example embodiment of an operational flow for generating a drop pattern. The flow starts in block B1200 and then proceeds to block B1205, where the drop-pattern-generation device obtains one or more images of a substrate. The flow then advances to block B1210, where the drop-pattern-generation device determines (e.g., detects), based on the one or more images, at least some of the following: one or more edges of a feature pattern, an edge of the substrate, and an active edge of the substrate. The flow then splits into a first flow and a second flow, which may be performed serially or concurrently (at least in part).

The first flow then moves to block B1220, where the drop-pattern-generation device determines an offset of the feature pattern based on the one or more images and on at least some of the edges (the substrate edge, the one or more feature pattern edges, and the active edge). Then, in block B1222, the drop-pattern-generation device determines an angle of the feature pattern based on the one or more additional images and on at least some of the edges (the substrate edge, the one or more feature pattern edges, and the active edge). The first flow then moves to block B1224, where the drop-pattern-generation device generates a transformation for a drop pattern based on at least the offset of the feature pattern and the angle of the feature pattern. Then, in block B1226, the drop-pattern-generation device obtains the drop pattern and transforms the drop pattern according to the transformation, thereby generating a transformed drop pattern. Also, the drop pattern may be oversized relative to the substrate (i.e., larger than the substrate) to allow for cropping (e.g., cropping to correct for chucking and feature-pattern offsets). The first flow then rejoins the second flow in block B1240.

From block B1210, the second flow proceeds to block B1230. In block B1230, the drop-pattern-generation device determines a bounding shape of the feature pattern based on the one or more edges of the feature pattern and on the one or more images. For example, the bounding shape may be a circle, an ellipse, or a polygon. And the shape of the bounding shape may be selected to match the shape of a superstrate contact area. The area of the bounding shape may be the smallest area that allows the bounding shape to encompass the entire feature pattern (the smallest area within which all of the feature pattern lies).

The second flow then moves to block B1232, where the drop-pattern-generation device identifies a shape of the active edge (active-edge shape) on the substrate (e.g., using a machine-learning model). For example, the drop-pattern-generation device may use one or more of the following to identify the active-edge shape: edge detection, filtering, and a fit/prediction algorithm.

Next, in block B1234, the drop-pattern-generation device obtains a shape of a superstrate contact area (superstrate-contact-area shape). For example, the superstrate-contact-area shape, including its dimensions, may have been previously stored in storage, and the drop-pattern-generation device may retrieve the superstrate-contact-area shape from storage.

Figure 13A:
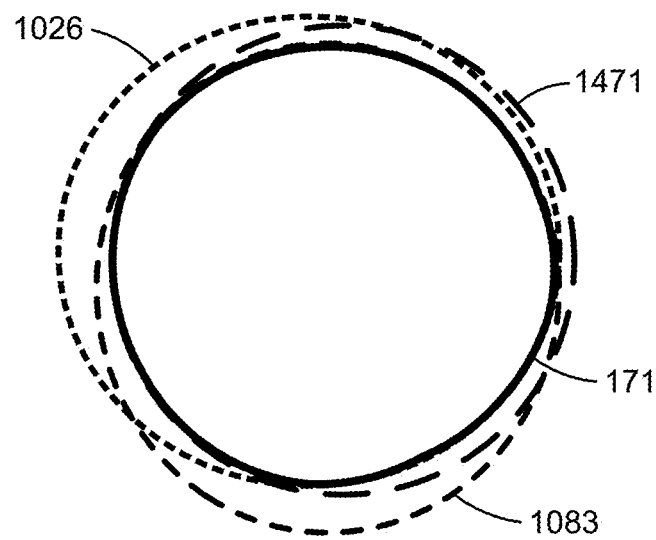
FIG. 13A illustrates an example embodiment of an intersection of a bounding shape, an active-edge shape, and a superstrate-contact-area shape.

The second flow then proceeds to block B1236, where the drop-pattern-generation device calculates an intersection of the bounding shape, the active-edge shape, and the superstrate-contact-area shape. Also, in block B1236, the drop-pattern-generation device may obtain and use alignment data that indicate the relative positions of the bounding shape, the active-edge shape, and the superstrate-contact-area shape. For example, FIG. 13A illustrates an example embodiment of an intersection 171 of a bounding shape 1026, an active-edge shape 1471, and a superstrate-contact-area shape 1083.

The second flow then rejoins the first flow in block B1240.

Figure 13B:
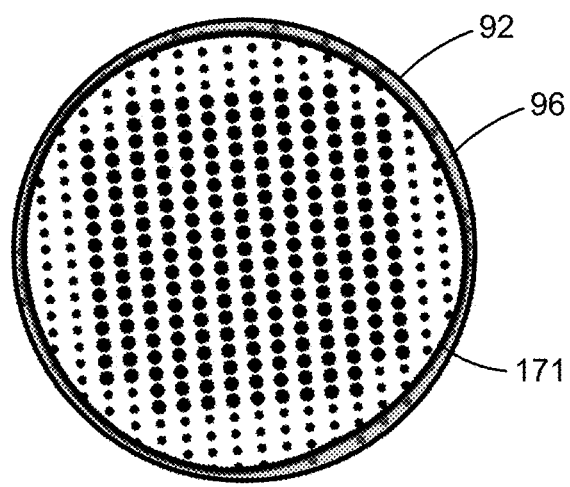
FIG. 13B illustrates an example embodiment of an intersection and a transformed drop pattern.

In block B1240, the drop-pattern-generation device crops the transformed drop pattern based on the intersection. For example, the drop-pattern-generation device may crop out all portions of the transformed drop pattern that do not lie within the intersection. FIG. 13B illustrates an example embodiment of an intersection 171 and a transformed drop pattern 92. The cropped-out portions 96 of the drop pattern 92, which lie outside of the intersection 171, are indicated by gray.

The flow then ends in block B1245. And a nanoimprint lithography system can obtain the transformed drop pattern and deposit drops of formable material on the substrate according to the transformed drop pattern.

Figure 14:
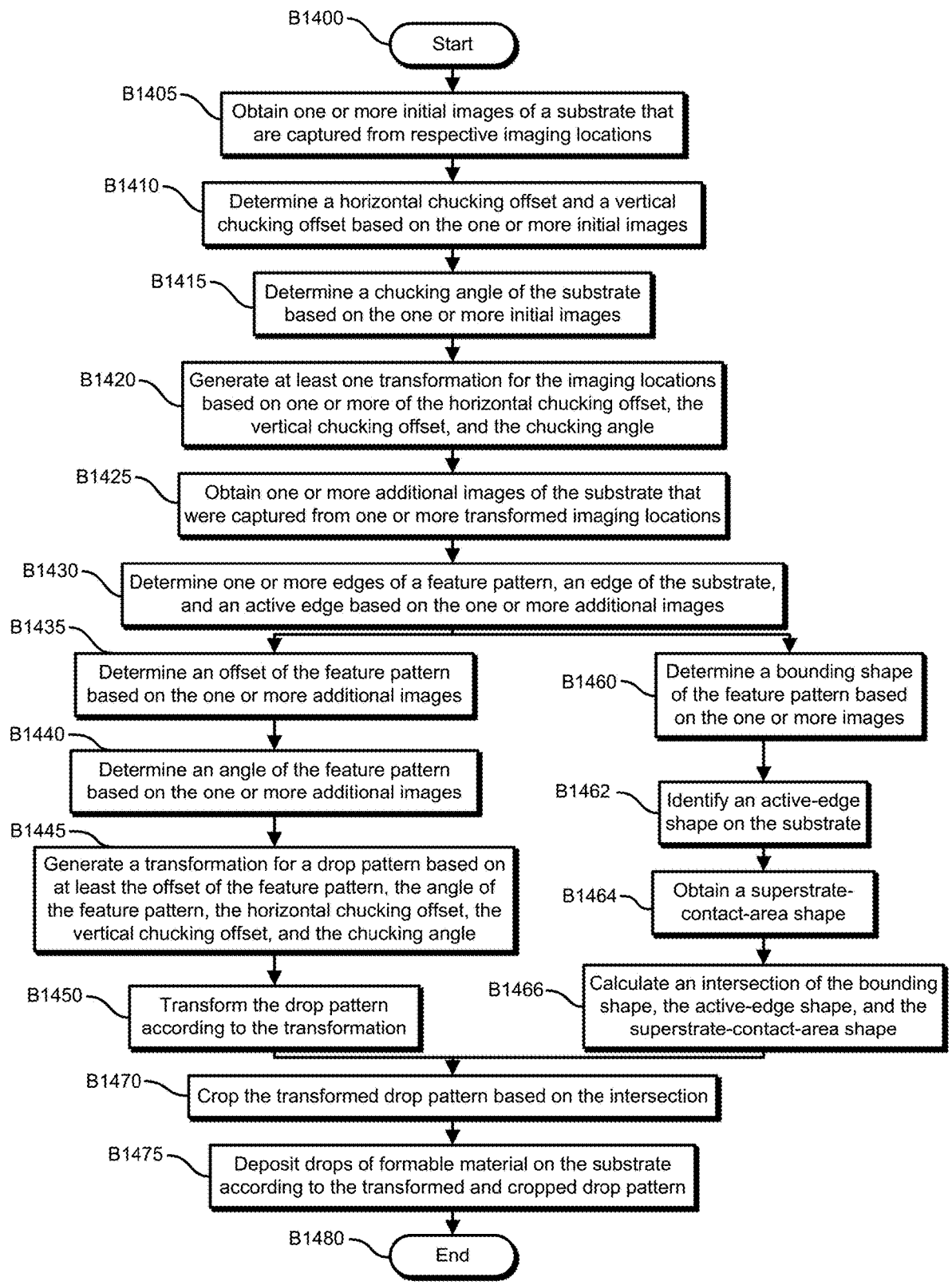
FIG. 14 illustrates an example embodiment of an operational flow for generating a drop pattern.

FIG. 14 illustrates an example embodiment of an operational flow for generating a drop pattern. The flow begins in block B1400 and then moves to block B1405, where a nanoimprint lithography system obtains one or more initial images of a substrate that are captured from respective imaging locations.

Next, in block B1410, the nanoimprint lithography system determines a horizontal chucking offset and a vertical chucking offset based on the one or more initial images. For example, the nanoimprint lithography system may use machine vision to detect the active edge of the substrate, and then use the active edge to determine the horizontal chucking offset and the vertical chucking offset. Then, in block B1415, the nanoimprint lithography system determines a chucking angle of the substrate based on the one or more initial images.

The flow then moves to block B1420, where the nanoimprint lithography system generates at least one transformation for the imaging locations based on one or more of the following: the horizontal chucking offset, the vertical chucking offset, and the chucking angle of the substrate. For example, ideal imaging locations may be stored, and transformations between the ideal imaging locations and the respective imaging locations from block B1405 may be determined.

Next, in block B1425, the nanoimprint lithography system obtains one or more additional images of the substrate that were captured from one or more transformed imaging locations. For example, the nanoimprint lithography system may move the substrate by moving a substrate positioning stage according to the transformation for the imaging locations, and then capture the one or more additional images of the substrate using one or more cameras. Also, in embodiments in which a transformation is generated for each camera, the nanoimprint lithography system can move the cameras according to their respective transformations and then capture the one or more additional images of the substrate.

Accordingly, blocks B1405-B1425 obtain images that can compensate for variations in the position and angle of a substrate on a substrate chuck.

The flow then advances to block B1430, where the nanoimprint lithography system determines (e.g., detects), based on the one or more additional images, at least some of the following: one or more edges of a feature pattern, an edge of the substrate, and an active edge of the substrate. The flow then splits into a first flow and a second flow. The first flow moves to block B1435, and the second flow moves to block B1460.

In block B1435, the nanoimprint lithography system determines an offset of the feature pattern based on the one or more additional images, and, in some embodiments, on at least some of the edges (the one or more edges of the feature pattern, the edge of the substrate, and the active edge). Then, in block B1440, the nanoimprint lithography system determines an angle of the feature pattern based on the one or more additional images and, in some embodiments, on at least some of the edges (the one or more edges of the feature pattern, the edge of the substrate, and the active edge).

The first flow then advances to block B1445, where the nanoimprint lithography system generates a transformation for a drop pattern based on at least the offset of the feature pattern, the angle of the feature pattern, the horizontal chucking offset, the vertical chucking offset, and the chucking angle of the substrate. For example, the transformation may be based on the accumulated offsets (the offset of the feature pattern, the horizontal chucking offset, the vertical chucking offset) and angles (the angle of the feature pattern, the chucking angle of the substrate).

Then, in block B1450, the nanoimprint lithography system obtains a drop pattern (e.g., a predetermined drop pattern for the feature pattern that is stored in a storage device) and transforms the drop pattern according to the transformation, thereby generating a transformed drop pattern. The first flow then rejoins the second flow in block B1470.

From block B1430, the second flow proceeds to block B1460, where the nanoimprint lithography system determines a bounding shape of the feature pattern based on the one or more edges of the feature pattern and on the one or more images. For example, the bounding shape may be a circle, an ellipse, or a polygon. And the shape of the bounding shape may be selected to match a superstrate-contact-area shape. The area of the bounding shape may have the smallest area that allows the bounding shape to encompass all of the feature pattern.

The second flow then moves to block B1462, where the nanoimprint lithography system identifies an active-edge shape on the substrate (e.g., using a machine-learning model). For example, the nanoimprint lithography system may use one or more of the following to identify the active-edge shape: edge detection, filtering, and a fit/prediction algorithm.

Next, in block B1464, the nanoimprint lithography system obtains a superstrate-contact-area shape. For example, the superstrate-contact-area shape, including its dimensions, may have been previously stored in storage, and the nanoimprint lithography system may retrieve the superstrate-contact-area shape from storage.

The second flow then proceeds to block B1466, where the nanoimprint lithography system calculates an intersection of the bounding shape, the active-edge shape, and the superstrate-contact-area shape. Also, in block B1466, the nanoimprint lithography system may obtain and use alignment data that indicate the relative positions of the bounding shape, the active-edge shape, and the superstrate-contact-area shape. The second flow then rejoins the first flow in block B1470.

In block B1470, the nanoimprint lithography system crops the transformed drop pattern based on the intersection. For example, the nanoimprint lithography system may crop out all portions of the transformed drop pattern that do not lie within the intersection. Then, in block B1475, the nanoimprint lithography system deposits drops of formable material on the substrate according to the transformed and cropped drop pattern. Finally, the flow ends in block B1480.

Figure 15:
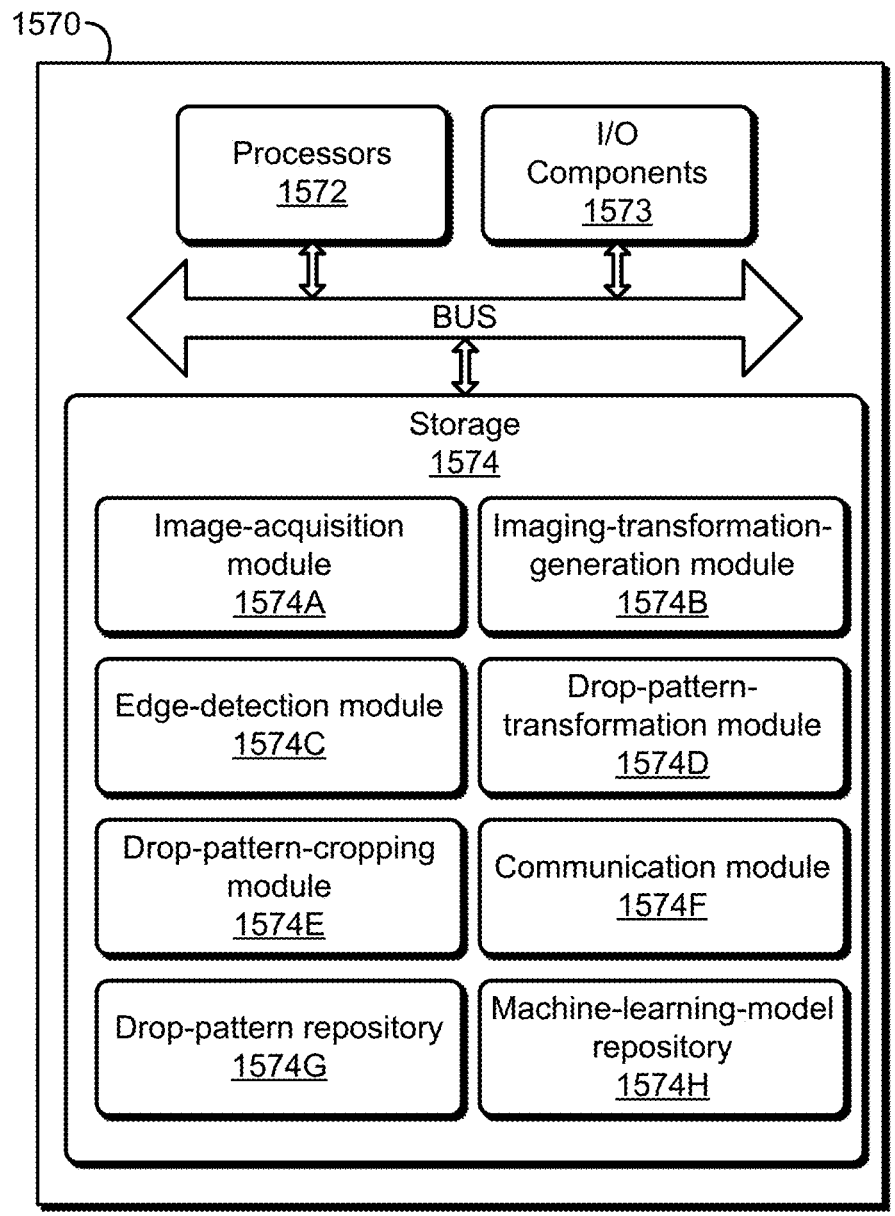
FIG. 15 illustrates an example embodiment of a drop-pattern-generation device.

FIG. 15 illustrates an example embodiment of a drop-pattern-generation device. The drop-pattern-generation device 1570 includes one or more processors 1572, one or more I/O components 1573, and storage 1574. Also, the hardware components of the drop-pattern-generation device 1570 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 1572 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 1573 may include communication components that communicate with one or more of the following: a substrate positioning stage, an imprint head, a fluid dispenser, an energy source, and a camera. Also, the I/O components 1573 may include communication components (e.g., a graphics card, a network-interface controller) that communicate with a network, a nanoimprint-lithography-control device, or with input or output devices (not illustrated), for example a display device, a keyboard, a mouse, a printing device, a touch screen, a light pen, an optical-storage device, a scanner, a microphone, a drive, a joystick, and a control pad.

The storage 1574 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 1574, which may include both ROM and RAM, can store computer-readable data or computer-executable instructions.

The drop-pattern-generation device 1570 also includes an image-acquisition module 1574A, an imaging-transformation-generation module 1574B, an edge-detection module 1574C, a drop-pattern-transformation module 1574D, a drop-pattern-cropping module 1574E, and a communication module 1574F. A module includes logic, computer-readable data, or computer-executable instructions. In the embodiment shown in FIG. 15, the modules are implemented in software (e.g., Assembly, C, C++, C#, Java, BASIC, Perl, Python, Visual Basic). However, in some embodiments, the modules are implemented in hardware (e.g., customized circuitry) or, alternatively, a combination of software and hardware. When the modules are implemented, at least in part, in software, then the software can be stored in the storage 1574. Also, some embodiments of the drop-pattern-generation device 1570 include additional modules, omit some of these modules, combine these modules into fewer modules, or divide these modules into more modules. Additionally, the drop-pattern-generation device 1570 includes a drop-pattern repository 1574G and a machine-learning-model repository 1574H. The drop-pattern repository 1574G stores drop patterns, including cropped drop patterns, and the machine-learning-model repository 1574H stores machine-learning models (e.g., machine-learning models that detect an active edge, machine-learning models that detect feature-pattern edges, machine-learning models that detect a substrate edge, machine-learning models that detect a chucking offset, machine-learning models that detect a chucking angle, machine-learning models that detect a feature-pattern offset, machine-learning models that detect a feature-pattern angle).

The image-acquisition module 1574A includes instructions that cause the drop-pattern-generation device 1570 to obtain (e.g., set, receive) one or more images (e.g., initial images, additional images). For example, some embodiments of the image-acquisition module 1574A include instructions that cause the drop-pattern-generation device 1570 to perform at least some of the operations that are described in block B705 in FIG. 7, in blocks B1005 and B1025 in FIG. 10, in block B1205 in FIG. 12, and in blocks B1405 and B1425 in FIG. 14.

The imaging-transformation-generation module 1574B includes instructions that cause the drop-pattern-generation device 1570 to determine a horizontal chucking offset based on one or more images (e.g., initial images), to determine a vertical chucking offset based on one or more images (e.g., initial images), to determine a chucking angle based on one or more images (e.g., initial images), or to generate one or more transformations for imaging locations based on the horizontal chucking offset, the vertical chucking offset, or the chucking angle. For example, some embodiments of the imaging-transformation-generation module 1574B include instructions that cause the drop-pattern-generation device 1570 to perform at least some of the operations that are described in blocks B1010-B1020 in FIG. 10 or in blocks B1410-B1420 in FIG. 14.

The edge-detection module 1574C includes instructions that cause the drop-pattern-generation device 1570 to detect edges, including the following: edges of feature patterns, substrate edges, and active edges. For example, some embodiments of the edge-detection module 1574C include instructions that cause the drop-pattern-generation device 1570 to perform at least some of the operations that are described in block B710 in FIG. 7, in block B1030 in FIG. 10, in block B1210 in FIG. 12, or in block B1430 in FIG. 14.

The drop-pattern-transformation module 1574D includes instructions that cause the drop-pattern-generation device 1570 to determine offsets of feature patterns, to determine angles of feature patterns, to generate respective transformations for drop patterns, and to transform drop patterns based on their respective transformations. For example, some embodiments of the drop-pattern-transformation module 1574D include instructions that cause the drop-pattern-generation device 1570 to perform at least some of the operations that are described in blocks B725-B730 in FIG. 7, in blocks B1035-B1050 in FIG. 10, in blocks B1220-B1226 in FIG. 12, or in blocks B1435-B1450 in FIG. 14.

The drop-pattern-cropping module 1574E includes instructions that cause the drop-pattern-generation device 1570 to determine respective bounding shapes of feature patterns; identify respective active-edge shapes of substrates; obtain superstrate-contact-area shapes; calculate intersections of bounding shapes, active-edge shapes, and superstrate-contact-area shapes; and crop drop patterns (e.g., transformed drop patterns) according to the intersections. For example, some embodiments of the drop-pattern-cropping module 1574E include instructions that cause the drop-pattern-generation device 1570 to perform at least some of the operations that are described in blocks B1230-B1236 in FIG. 12 or in blocks B1460-B1466 in FIG. 14.

The communication module 1574F includes instructions that cause the drop-pattern-generation device 1570 to communicate with one or more other devices (e.g., a nanoimprint-lithography-control device, a substrate positioning stage, an imprint head, a fluid dispenser, an energy source, a camera, a monitor, another computing device).

Also, some embodiments of nanoimprint-lithography-control devices (e.g., of the nanoimprint-lithography-control device 135 in FIG. 1) include an image-acquisition module 1574A, an imaging-transformation-generation module 1574B, an edge-detection module 1574C, a drop-pattern-transformation module 1574D, a drop-pattern-cropping module 1574E, or a communication module 1574F.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method comprising:
obtaining one or more images of a substrate and of a feature pattern on the substrate;
determining one or more edges of the feature pattern based on the one or more images;
determining an offset of the feature pattern and an angle of the feature pattern based on the one or more images and on the one or more edges of the feature pattern, wherein the offset of the feature pattern indicates a distance between a first point on the feature pattern and a second point on the substrate, and wherein the angle of the feature pattern is relative to a first axis;
generating a transformation for a first drop pattern based on the offset of the feature pattern and on the angle of the feature pattern, wherein the transformation includes a translation or a rotation;
generating a second drop pattern, wherein generating the second drop pattern includes transforming the first drop pattern according to the transformation; and
depositing drops of formable material on the substrate according to the second drop pattern.

2. The method of claim 1, wherein the offset includes a horizontal offset on the first axis and a horizontal offset on a second axis that is perpendicular to the first axis.

3. The method of claim 1, wherein obtaining the one or more images includes:
obtaining a plurality of initial images of the substrate, wherein each image of the plurality of initial images was captured from a respective imaging location of a plurality of imaging locations;
calculating a horizontal chucking offset and a vertical chucking offset based on the plurality of initial images, wherein the horizontal chucking offset indicates a horizontal distance between a third point on the substrate and a fourth point on a substrate chuck that holds the substrate, and wherein the vertical chucking offset indicates a vertical distance between a fifth point on the substrate and a sixth point on the substrate chuck that holds the substrate;
calculating a chucking angle based on the plurality of initial images, wherein the chucking angle indicates an angle of the substrate relative to the substrate chuck that holds the substrate;
calculating a second transformation based on the horizontal chucking offset, on the vertical chucking offset, and on the chucking angle;
transforming the plurality of imaging locations based on the second transformation, thereby generating a plurality of transformed imaging locations, wherein the second transformation maps the plurality of imaging locations to the plurality of transformed imaging locations; and
capturing the one or more images of the substrate and of the feature pattern on the substrate, wherein each image of the one or more images is captured from a respective transformed imaging location of the plurality of transformed imaging locations.

4. The method of claim 3, wherein generating the transformation for the first drop pattern is further based on the horizontal chucking offset, the vertical chucking offset, or the chucking angle.

5. The method of claim 1, wherein the transformation includes a translation and a rotation.

6. The method of claim 1, further comprising:
determining a bounding shape of the feature pattern,
wherein generating the second drop pattern includes, after transforming the first drop pattern according to the transformation, cropping the transformed first drop pattern based on the bounding shape of the feature pattern.

7. The method of claim 6, further comprising:
obtaining a superstrate-contact-area shape,
wherein the superstrate-contact-area shape is defined by a shape of a tapered region of the superstrate, and
wherein cropping the transformed first drop pattern is further based on the superstrate-contact-area shape.

8. The method of claim 7, further comprising:
obtaining a substrate active-edge shape; and
calculating an intersection of the bounding shape of the feature pattern, the superstrate-contact-area shape, and the substrate active-edge shape,
wherein cropping the transformed first drop pattern is further based on the intersection.

9. The method of claim 1, further comprising:
manufacturing one or more articles, wherein manufacturing the one or more articles includes:
bringing a superstrate into contact with the formable material that has been deposited on the substrate;
after bringing the superstrate into contact with the fluid that has been deposited on the substrate, curing the formable material that has been deposited on the substrate; and
after curing the formable material that has been deposited on the substrate, processing the substrate so as to manufacture the one or more articles.

10. The method of claim 1, wherein the transformation for the first drop pattern is further based on the one or more edges of the feature pattern.

11. The method of claim 1,
wherein the first point on the feature pattern is a center of the feature pattern, and
wherein the second point on the substrate is a center of the substrate.

12. The method of claim 1,
wherein the first point on the feature pattern is on an edge of the one or more edges of the feature pattern, and
wherein the second point on the substrate is on an edge of the substrate or is on an active edge of the substrate.

13. The method of claim 1, wherein the first axis is a movement axis of a substrate chuck that holds the substrate, is an axis of a fluid-dispense head, or is an axis defined by imaging positions of one or more cameras that captured the one or more images.

14. The method of claim 3, wherein the second transformation includes a translation or a rotation.

15. The method of claim 14, wherein the second transformation includes a translation and a rotation.

16. A device for drop-pattern generation, the device comprising:
one or more computer-readable storage media; and
one or more processors that are in communication with the one or more computer-readable storage media and that cooperate with the one or more computer-readable storage media to cause the device to perform operations comprising:
obtaining one or more images of a substrate and of a feature pattern on the substrate;
determining one or more edges of the feature pattern based on the one or more images;
determining an offset of the feature pattern and an angle of the feature pattern based on the one or more images and on the one or more edges of the feature pattern, wherein the offset of the feature pattern indicates a distance between a first point on the feature pattern and a second point on the substrate, and wherein the angle of the feature pattern is relative to a first axis;
generating a transformation for a first drop pattern based on the offset of the feature pattern and on the angle of the feature pattern, wherein the transformation includes a translation or a rotation;
generating a second drop pattern, wherein generating the second drop pattern includes transforming the first drop pattern according to the transformation; and
controlling a substrate positioning stage and a fluid dispenser to deposit drops of formable material on the substrate according to the second drop pattern.

17. The device of claim 16, wherein the transformation includes a translation and a rotation.

18. The device of claim 16, wherein the operations further comprise:
determining a bounding shape of the feature pattern;
obtaining a substrate active-edge shape;
obtaining a superstrate-contact-area shape, wherein the superstrate-contact-area shape is defined by a shape of a tapered region of the superstrate; and
calculating an intersection of the bounding shape of the feature pattern, the superstrate-contact-area shape, and the substrate active-edge shape,
wherein generating the second drop pattern includes, after transforming the first drop pattern according to the transformation, cropping the transformed first drop pattern based on the intersection.

19. The device of claim 18, wherein the bounding shape of the feature pattern is an ellipse or a circle,
wherein the substrate active-edge shape is an ellipse or a circle, and
wherein the superstrate-contact-area shape is an ellipse or a circle.

20. The device of claim 16, wherein obtaining the one or more images includes:
obtaining a plurality of initial images of the substrate, wherein each image of the plurality of initial images was captured from a respective imaging location of a plurality of imaging locations;
calculating a horizontal chucking offset and a vertical chucking offset based on the plurality of initial images, wherein the horizontal chucking offset indicates a horizontal distance between a third point on the substrate and a fourth point on a substrate chuck that holds the substrate, and wherein the vertical chucking offset indicates a vertical distance between a fifth point on the substrate and a sixth point on the substrate chuck that holds the substrate;
calculating a chucking angle based on the plurality of initial images, wherein the chucking angle indicates an angle of the substrate relative to the substrate chuck that holds the substrate;

calculating a second transformation based on the horizontal chucking offset, on the vertical chucking offset, and the chucking angle; and transforming the plurality of imaging locations based on the second transformation, thereby generating a plurality of transformed imaging locations, wherein the second transformation maps the plurality of imaging locations to the plurality of transformed imaging locations, wherein each image of the one or more images was captured from a respective transformed imaging location of the plurality of transformed imaging locations.

21. The device of claim 20, wherein generating the transformation for the first drop pattern is further based on the horizontal chucking offset, the vertical chucking offset, or the chucking angle.

22. A system for drop-pattern generation, the system comprising:
- a plurality of image-capturing devices;
- one or more computer-readable storage media; and
- one or more processors that are in communication with the one or more computer-readable storage media and that cooperate with the one or more computer-readable storage media to cause the system to perform operations comprising:
  - capturing, with the plurality of image-capturing devices, one or more images of a substrate and of a feature pattern on the substrate;
  - determining one or more edges of the feature pattern based on the one or more images;
  - determining an offset of the feature pattern and an angle of the feature pattern based on the one or more images and on the one or more edges of the feature pattern, wherein the offset of the feature pattern indicates a distance between a first point on the feature pattern and a second point on the substrate, and wherein the angle of the feature pattern is relative to a first axis;
  - generating a transformation for a first drop pattern based on the offset of the feature pattern and on the angle of the feature pattern, wherein the transformation includes a translation or a rotation;
  - generating a second drop pattern, wherein generating the second drop pattern includes transforming the first drop pattern according to the transformation; and
  - controlling a substrate positioning stage and a fluid dispenser to deposit drops of formable material on the substrate according to the second drop pattern.

23. The system of claim 22, wherein the operations further comprise:
- capturing, with the plurality of image-capturing devices, a plurality of initial images of the substrate, wherein each image of the plurality of initial images was captured from a respective imaging location of a plurality of initial imaging locations;
- calculating a horizontal chucking offset and a vertical chucking offset based on the plurality of initial images, wherein the horizontal chucking offset indicates a horizontal distance between a third point on the substrate and a fourth point on a substrate chuck that holds the substrate, and wherein the vertical chucking offset indicates a vertical distance between a fifth point on the substrate and a sixth point on the substrate chuck that holds the substrate;
- calculating a chucking angle based on the plurality of initial images, wherein the chucking angle indicates an angle of the substrate relative to the substrate chuck that holds the substrate;
- calculating a second transformation based on the horizontal chucking offset, the vertical chucking offset, and the chucking angle;
- transforming the plurality of imaging locations based on the second transformation, thereby generating a plurality of transformed imaging locations, wherein the second transformation maps the plurality of imaging locations to a plurality of transformed imaging locations; and
- sending movement commands to a movable stage that supports the substrate and a chuck that holds the substrate, wherein the movement commands are based on the plurality of transformed imaging locations, and wherein the movement commands position the substrate such that each image-capturing device of the plurality of image-capturing devices is positioned at a respective imaging location of the plurality of transformed imaging locations, wherein each image of the one or more images is captured from a respective transformed imaging location of the plurality of transformed imaging locations.

* * * * *